United States Patent
Aloui et al.

(10) Patent No.: US 11,480,422 B2
(45) Date of Patent: Oct. 25, 2022

(54) METHOD FOR ESTIMATING AN ANGULAR DEVIATION BETWEEN THE MAGNETIC AXIS AND A REFERENCE AXIS OF A MAGNETIC OBJECT

(71) Applicant: COMMISSARIAT A L'ENERGIE ATOMIQUE ET AUX ENERGIES ALTERNATIVES, Paris (FR)

(72) Inventors: Saifeddine Aloui, Fontaine (FR); Franck Vial, Paladru (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 16/317,434

(22) PCT Filed: Jul. 10, 2017

(86) PCT No.: PCT/FR2017/051870
§ 371 (c)(1),
(2) Date: Jan. 11, 2019

(87) PCT Pub. No.: WO2018/011492
PCT Pub. Date: Jan. 18, 2018

(65) Prior Publication Data
US 2019/0301848 A1    Oct. 3, 2019

(30) Foreign Application Priority Data

Jul. 13, 2016 (FR) ...................................... 1656785
Nov. 30, 2016 (FR) ...................................... 1661693

(51) Int. Cl.
*G01B 7/31* (2006.01)
*G01V 3/08* (2006.01)
(Continued)

(52) U.S. Cl.
CPC .......... *G01B 7/31* (2013.01); *G01R 33/0035* (2013.01); *G01R 33/02* (2013.01); *G01V 3/08* (2013.01)

(58) Field of Classification Search
CPC ........ G01B 7/31; G01V 3/08; G01R 33/0035; G01R 33/02; G01R 33/0052;
(Continued)

(56) References Cited

U.S. PATENT DOCUMENTS 7,868,610 B2 * 1/2011 Velinsky ................. G01C 17/30
324/207.25
10,422,664 B2 * 9/2019 Zeller ................... G01D 5/2006
(Continued)

FOREIGN PATENT DOCUMENTS

FR    3 003 039 A1    9/2014
FR    3 015 049 A1    6/2015

OTHER PUBLICATIONS

International Search Report dated Sep. 12, 2017 in PCT/FR2017/051870 filed Jul. 10, 2017.

*Primary Examiner* — Lee E Rodak
(74) *Attorney, Agent, or Firm* — Oblon, McClelland, Maier & Neustadt, L.L.P.

(57) ABSTRACT

A method for estimating an angular deviation between a reference axis of a magnetic object and a magnetic axis co-linear to a magnetic moment of the magnetic object, including: a) positioning the magnetic object facing at least one magnetometer; b) rotating the magnetic object about the reference axis; c) measuring, during the rotating, the magnetic field, using the magnetometer; and d) estimating the angular deviation from the magnetic field measurements.

15 Claims, 9 Drawing Sheets

(51) Int. Cl.
*G01R 33/00* (2006.01)
*G01R 33/02* (2006.01)

(58) Field of Classification Search
CPC .......... G01R 33/0094; G01R 33/0206; G01R 33/028; G01R 33/077; G01R 33/093; G01R 33/096; G01R 33/10; G01R 33/12; G01R 33/1215; G05B 19/401; G05B 2219/37124
See application file for complete search history.

(56) References Cited

U.S. PATENT DOCUMENTS

| | | | |
|---|---|---|---|
| 10,802,088 B2 * | 10/2020 | Alcouffe | G01R 33/0052 |
| 2003/0085059 A1 * | 5/2003 | Kuckes | E21B 47/024 |
| | | | 175/45 |
| 2005/0077085 A1 * | 4/2005 | Zeller | G01D 5/2006 |
| | | | 175/45 |
| 2009/0114039 A1 * | 5/2009 | Schultze | A61B 5/062 |
| | | | 73/861.77 |
| 2011/0278067 A1 * | 11/2011 | Clark | G01B 7/30 |
| | | | 175/45 |
| 2012/0078571 A1 | 3/2012 | Yamada et al. | |
| 2015/0168123 A1 | 6/2015 | Hautson | |
| 2016/0018485 A1 * | 1/2016 | Hautson | G01R 33/12 |
| | | | 702/57 |
| 2018/0224511 A1 * | 8/2018 | Alcouffe | G05B 19/401 |

* cited by examiner

METHOD FOR ESTIMATING AN ANGULAR DEVIATION BETWEEN THE MAGNETIC AXIS AND A REFERENCE AXIS OF A MAGNETIC OBJECT

TECHNICAL FIELD

The invention relates to a method and to a device for estimating an angular deviation between the magnetic axis of the magnetic moment of a magnetic object and a reference axis of said magnetic object.

PRIOR ART

The use of magnetic objects is known, particularly within the context of a system for recording the trace of a magnetic pencil on a writing medium. The magnetic object in this case is understood to be an object with which a non-zero magnetic moment is associated, for example, a permanent magnet attached to a non-magnetic pencil.

By way of an example, document WO 2014/053526 discloses a system for recording the trace of a pencil to which an annular permanent magnet is attached. The magnetic object, in this case the permanent magnet, comprises a magnetic material, for example a ferromagnetic or ferrimagnetic material, evenly distributed around a mechanical axis, called reference axis, which corresponds to its axis of rotation. The magnet is designed so that its magnetic moment is substantially co-linear to the reference axis.

The system for recording the trace of the pencil provided with the permanent magnet comprises an array of magnetometers capable of measuring the magnetic field generated by the permanent magnet. The magnetometers are attached to a writing medium.

However, the trace recording method assumes that the magnetic axis of the permanent magnet, which is defined as the axis passing through the magnetic moment, is effectively co-linear to the reference axis, or exhibits an acceptable angular deviation between the magnetic axis and the reference axis. Indeed, an angular deviation of several tens of degrees can result in an error in recording the trace, which can then exhibit a detrimental lack of precision. It then may be necessary for a prior estimate to be made of the angular deviation between the magnetic axis and the reference axis of the magnetic object.

DISCLOSURE OF THE INVENTION

The aim of the invention is to propose a method for estimating an angular deviation between a reference axis of a magnetic object and a magnetic axis co-linear to a magnetic moment of said magnetic object. To this end, the estimation method comprises the following steps:

a) positioning said magnetic object facing at least one magnetometer capable of measuring a magnetic field in the presence of the magnetic object;
b) rotating said magnetic object about said reference axis;
c) measuring, during the rotation and using said magnetometer, the magnetic field at different instants of a measurement duration;
d) estimating the angular deviation from the measurements of the magnetic field.

Preferably, the estimation step comprises:
a sub-step of identifying a magnetic field, called minimum magnetic field, and a magnetic field, called maximum magnetic field, from the measurements of the magnetic field; and
a sub-step of computing the angular deviation from the identified minimum and maximum magnetic fields, and from geometric parameters representing the position of the magnetometer relative to the magnetic object.

Preferably, during the identification sub-step, the minimum and maximum magnetic fields are respectively identified from the minimum and maximum values of the norm of the measurements of the magnetic field.

Preferably, said geometric parameters are the coordinates and the distance of the magnetometer relative to the magnetic object, in a plane passing through the reference axis and containing the magnetometer.

The angular deviation can be computed from a coefficient equal to the ratio of the norm of the vector formed from the subtraction of the minimum and maximum magnetic fields to the norm of the vector formed from the addition of the minimum and maximum magnetic fields, and from said geometric parameters.

The angular deviation can be computed from the following equation:

$$\overline{\alpha} = \tan^{-1}\left(\left(\frac{\|B_{max}^d - B_{min}^d\|}{\|B_{max}^d + B_{min}^d\|}\right) \cdot \left(\frac{\sqrt{r^2 z^2 + (z^2 - d^2/a)^2}}{\sqrt{r^2 z^2 + (r^2 - d^2/a)^2}}\right)\right),$$

where d is the distance between the magnetometer and the magnetic object, z and r are the coordinates of the magnetometer relative to the magnetic object along an axis, respectively parallel and orthogonal to the reference axis, and where a is a predetermined coefficient.

During the rotation step, the magnetic object can complete at least one rotation about the reference axis.

Said at least one magnetometer comprises at least three axes for detecting the magnetic field, said detection axes being non-parallel to each other.

Preferably, said at least one magnetometer is a single tri-axis magnetometer.

Preferably, said at least one magnetometer is positioned outside the reference axis or outside the perpendicular to the reference axis passing through the magnetic object.

Said at least one magnetometer can be positioned relative to said magnetic object at a coordinate z along an axis parallel to the reference axis and at a coordinate r along an axis orthogonal to the reference axis, such that the coordinate z is greater than or equal to the coordinate r.

The invention also relates to a method for characterizing a magnetic object having an angular deviation between a reference axis of said magnetic object and a magnetic axis co-linear to a magnetic moment of said magnetic object, comprising the following steps:

implementing the method for estimating the angular deviation according to any of the preceding features;
computing an amplitude of the magnetic moment associated with the magnetic object, from the estimated angular deviation, of the identified maximum magnetic field, and from said geometric parameters.

Preferably, the amplitude of the magnetic moment is computed from the ratio between the norm of the maximum magnetic field and the norm of a magnetic field, for a unitary amplitude of said magnetic moment, expressed analytically using the following equation:

$$\hat{B}_{max}^d(\overline{\alpha}, r, z) = \frac{b}{d^5}\begin{pmatrix} -\sin(\overline{\alpha})\frac{d^2}{a} + \sin(\overline{\alpha})r^2 + \cos(\overline{\alpha})rz \\ -\cos(\overline{\alpha})\frac{d^2}{a} + \cos(\overline{\alpha})z^2 + \sin(\overline{\alpha})rz \end{pmatrix},$$

where $\overline{\alpha}$ is the previously estimated angular deviation, d is the distance between the magnetometer and the magnetic object, z and r are the coordinates of the magnetometer relative to the magnetic object along an axis, respectively parallel and orthogonal to the reference axis, and where a and b are predetermined coefficients.

According to another embodiment, the estimation method comprises the following steps:
a) positioning said magnetic object facing a measurement plane defined by an array of magnetometers capable of measuring a magnetic field in the presence of the magnetic object;
b) rotating said magnetic object about said reference axis;
c) measuring, during the rotation and using said magnetometers, the magnetic field at different instants of a measurement duration;
d) estimating a magnetic moment, called instantaneous magnetic moment, of the magnetic object, at said different measurement instants, from the measured magnetic field;
e) estimating the mean angular deviation from said instantaneous magnetic moments.

The step of estimating the mean angular deviation can comprise a sub-step of estimating an invariant vector rotating about the reference axis from the instantaneous magnetic moments, the estimation of the mean angular deviation also being performed from said invariant vector.

The estimation of the mean angular deviation can comprise computing an angular deviation amplitude between the instantaneous magnetic moments relative to the invariant vector.

During the step of measuring the magnetic field, the magnetic object can complete a whole number, greater than or equal to 1, of rotations about the reference axis.

The estimation method can comprise a step of homogenizing an angular distribution of the instantaneous magnetic moments about the reference axis throughout the measurement duration, with this homogenization step comprising a computation by interpolating a time series, called homogenized series, of instantaneous magnetic moments, from a time series, called initial series, of previously obtained instantaneous magnetic moments, so that the successive instantaneous magnetic moments of the homogenized time series exhibit a substantially constant angular deviation.

The homogenization step can comprise an iterative phase of computing interpolated magnetic moments, during which a magnetic moment interpolated at a considered iteration is obtained from a magnetic moment interpolated at a previous iteration, a predetermined threshold value and a unit vector defined from two successive instantaneous magnetic moments of the initial time series.

The positioning step can comprise:
a sub-step of estimating a first dispersion parameter representing a dispersion of the intensity of the instantaneous magnetic moments of the magnetic object, for various positions, called vertical positions, of the magnetic object along an axis substantially orthogonal to the measurement plane;

a sub-step of positioning the magnetic object in a vertical position, for which the value of the first dispersion parameter is less than or equal to a predetermined threshold value.

The estimation method can comprise, prior to the positioning step, a step of measuring, using said magnetometers, an ambient magnetic field in the absence of the magnetic object, and can comprise a sub-step of subtracting the ambient magnetic field from the previously measured magnetic fields, so as to obtain the magnetic field generated by the magnetic object.

The estimation method can comprise a step of applying a low-pass filter to the values of components of the previously estimated instantaneous magnetic moments.

The low-pass filter can be a running mean on a given number of samples.

The number of samples can be predetermined so that a bias, which is defined as a difference between an angular deviation, called actual angular deviation, and the estimated mean angular deviation, is minimal, by absolute value, for a value called mean angular deviation threshold value.

The estimation method can comprise a step of sorting the magnetic object according to the difference in the estimated value of the mean angular deviation relative to a value called mean angular deviation threshold value.

The estimation method can comprise a step of estimating a parameter, called quality indicator, from the computation of a second dispersion parameter representing a dispersion of the values of a parameter, called instantaneous radius, computed as being the norm of an instantaneous vector defined between each instantaneous magnetic moment and the previously estimated invariant vector.

The estimation method can further comprise a step of comparing the second dispersion parameter to a predetermined threshold value.

Predetermining the threshold value can comprise the following sub-steps:
obtaining, Q times, with Q being a non-zero natural integer, a time distribution of said instantaneous radius, for the same magnetic object;
estimating, for each time distribution, a mean value, called mean radius, defined as the time mean of the instantaneous radius, so as to obtain a distribution of Q estimated mean radii;
estimating, from the distribution of the Q estimated mean radii, a mean value and a third dispersion parameter, called threshold value, representing a dispersion of the values of the estimated mean radii.

The invention also relates to a device for estimating a mean angular deviation between a magnetic axis and a reference axis of a magnetic object, comprising:
an array of magnetometers capable of measuring, at each measurement instant of a duration, a magnetic field disrupted by the magnetic object along at least one measurement axis, the magnetometers being spatially distributed so as to define a measurement plane;
a retention and rotation component capable of retaining the magnetic object in a position facing the measurement plane and of rotating the magnetic object along its reference axis;
a processor configure d to implement the estimation method according to any of the preceding features.

The invention also relates to an information recording medium, comprising instructions for implementing the estimation method according to any of the preceding features, said instructions being able to be executed by a processor.

BRIEF DESCRIPTION OF THE DRAWINGS

Further aspects, aims, advantages and features of the invention will become more clearly apparent upon reading the following detailed description of preferred embodiments of the invention, which are provided by way of non-limiting examples, and with reference to the accompanying drawings, in which.

DETAILED DISCLOSURE OF PARTICULAR EMBODIMENTS

In the figure s and throughout the remainder of the description, the same reference signs represent identical or similar elements. Furthermore, the various elements are not shown to scale in order to enhance the clarity of the figure s. Moreover, the various embodiments and variations are not mutually exclusive and can be combined together. Unless otherwise stated, the terms "substantially", "approximately", "of the order of" mean to the nearest 10%, and preferably to the nearest 5%, even to the nearest 1%.

The invention relates to a device and to a method for estimating the mean angular deviation between the magnetic axis associated with the magnetic moment of a magnetic object and a mechanical reference axis of this object.

The magnetic object comprises a material having a magnetic moment that is spontaneous, for example. It preferably involves the material of a permanent magnet. The magnetic object can be a cylindrical, for example, annular, permanent magnet, as shown in the previously cited document WO 2014/053526, in which case the reference axis corresponds to an axis of symmetry of the magnet, for example the axis of rotation of the magnet. It can also involve a utensil or a pencil equipped with such a magnet or comprising a different permanent magnet, for example integrated into the body of the pencil, in which case the reference axis can correspond to the longitudinal axis along which the pencil extends, passing through the writing tip or lead of the pencil. The term pencil is to be understood in the broadest sense and can encompass pens, felt-tipped pens, paintbrushes or any other writing or drawing instrument.

The magnetic material is preferably ferrimagnetic or ferromagnetic. It has a non-zero spontaneous magnetic moment, even in the absence of an external magnetic field. It can have a coercive magnetic field that is greater than 100 $A \cdot m^{-1}$ or 500 $A \cdot m^{-1}$ and its intensity is preferably greater than 0.01 $A \cdot m^2$, even 0.1 $A \cdot m^2$. The permanent magnet is hereafter considered to be approximated by a magnetic dipole. The magnetic axis of the object is defined as being the axis co-linear to the magnetic moment of the object. The reference axis in this case corresponds to an axis of symmetry of the magnetic object. The angular difference between the reference axis and the magnetic axis is denoted angular deviation.

Figure 1:
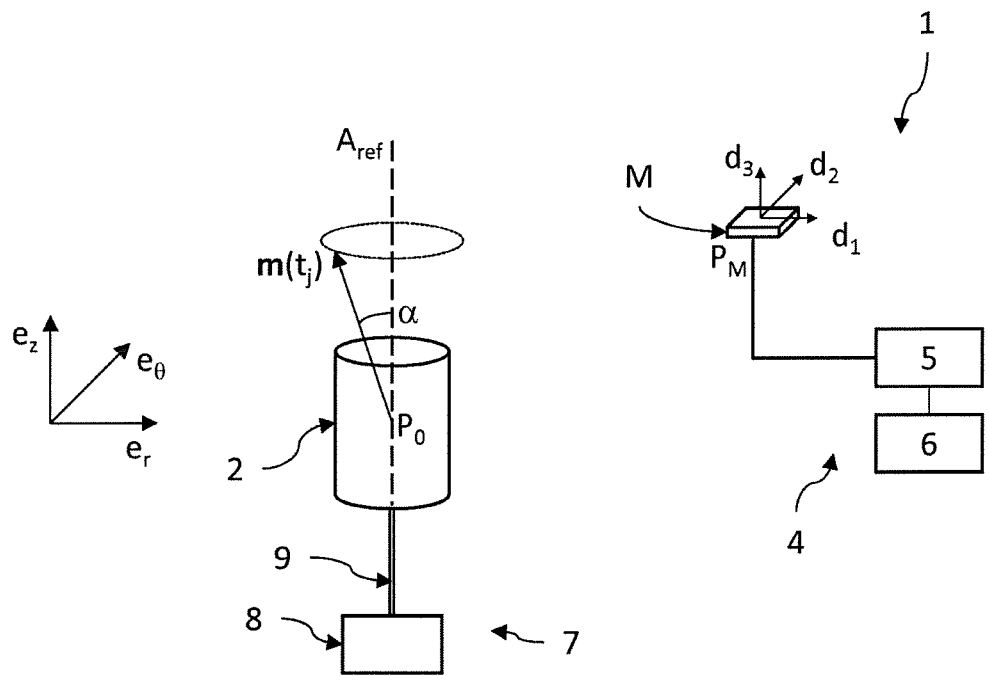
FIG. 1 is a schematic perspective view of a device for estimating a mean angular deviation of a magnetic object according to a first embodiment.

FIG. 1 is a schematic and partial perspective view of a device 1 for estimating an angular deviation $\overline{\alpha}$ of a magnetic object 2 according to a first embodiment. The magnetic object 2 in this case is a cylindrical, for example annular, permanent magnet.

The estimation device 1 is capable of measuring the magnetic field at different measurement instants, throughout a measurement duration T, in a coordinate system ($e_r$, $e_\theta$, $e_z$), and of estimating the value of the angular deviation $\overline{\alpha}$ of the magnetic object 2 on the basis of the measured values of the magnetic field.

A direct three-dimensional orthogonal coordinate system ($e_r$, $e_\theta$, $e_z$) is defined herein, where the axis $e_z$ is co-linear to the reference axis $A_{ref}$ and where the axes $e_r$ and $e_\theta$ are orthogonal to the axis $e_z$.

The magnet 2 is intended to be positioned at the center of the coordinate system ($e_r$, $e_\theta$, $e_z$), so that the position $P_o$ of the magnet 2 has the coordinates (o, o, o) in this coordinate system. The position $P_o$ of the magnet 2 corresponds to the coordinates of the geometric center of the magnet 2, i.e. to the unweighted barycenter of all the points of the magnet 2. Thus, the magnetic moment m of the magnet 2 has the components ($m_r$, $m_\theta$, $m_z$) in the coordinate system ($e_r$, $e_\theta$, $e_z$). Its norm, also called intensity or amplitude, is denoted $||m||$ or m. The magnet is intended to be oriented so that the axis $e_z$, corresponding to the axis of rotation of the magnet 2, coincides with the reference axis $A_{ref}$ thereof. Thus, when the magnet 2 will be set into rotation about its reference axis $A_{ref}$, the magnetic moment m will rotate about the direction $e_z$.

The estimation device 1 comprises a magnetic field measurement sensor with at least three distinct measurement axes $d_1$, $d_2$, $d_3$ in pairs, i.e. the measurement axes are not parallel to each other, and can thus comprise at least one tri-axis magnetometer.

The tri-axis magnetometer M is placed at a defined position $P_M$ (r,θ,z) facing the position $P_o$ of the magnet and therefore the center of the coordinate system ($e_r$, $e_θ$, $e_z$). This position is known and constant throughout the entire measurement duration T. Knowing the position can allow for a certain tolerance margin, for example of the order of 10%, if a relative uncertainty of the order of 20% is accepted on the estimated value of the angular deviation, or less, for example of the order of 1% for a relative uncertainty of the order of 2% on the value of the angular deviation.

The magnetometer M therefore measures the amplitude and the direction of the magnetic field B disrupted by the magnet 2. More specifically, it measures the norm of the orthogonal projection of the magnetic field B along the measurement axes $d_1$, $d_2$, $d_3$. The disrupted magnetic field B is understood to be the ambient magnetic field $B^a$, i.e. not disrupted by the magnet 2, to which the magnetic field $B^d$ generated by the magnet 2 is added.

The estimation device 1 further comprises a computation unit 4 able to store the measured values of the magnetic field throughout the measurement duration and to determine the angular deviation $\overline{\alpha}$ of the permanent magnet 2 from the measurements of the magnetic field B.

To this end, the magnetometer M is connected to the computation unit 4, in an electrical or other manner, using an information transmission bus (not shown). The computation unit 4 comprises a programmable processor 5 able to execute instructions stored on an information recording medium. It further comprises a memory 6 containing the instructions required to implement certain steps of a method for estimating the angular deviation $\overline{\alpha}$ using the processor 5. The memory 6 is also adapted to store the information measured at each measurement instant.

The computation unit 4 implements a mathematical model associating the measurements of the magnetometer M with the magnetic field and the position of the magnetometer M facing the magnet 2 in the coordinate system ($e_r$, $e_θ$, $e_z$). This mathematical model is constructed from equations of the electromagnetism, particularly the magnetostatic, and is particularly configure d by geometric parameters representing the position of the magnetometer M facing the magnet 2 in the coordinate system ($e_r$, $e_θ$, $e_z$).

In order to be able to approximate the permanent magnet 2 on a magnetic dipole, the distance between the permanent magnet 2 and the magnetometer M is greater than 2 times, 3 times, even 5 times, the largest dimension of the permanent magnet 2. This dimension can be less than 20 cm, even less than 10 cm, even less than 5 cm.

The estimation device 1 also comprises a retention and rotation component 7 capable of retaining the permanent magnet 2 relative to the magnetometer M in a known and constant position throughout the measurement duration.

It is also able to rotate the magnet 2 along its reference axis $A_{ref}$ during the measurement duration. Furthermore, during the measurement duration, the position of the permanent magnet 2 is fixed and only its orientation about the reference axis $A_{ref}$ varies over time. Thus, the reference axis $A_{ref}$ remains fixed in the coordinate system ($e_r$, $e_θ$, $e_z$). The retention and rotation component 7 comprises a motor 8 connected to an arm 9. The arm 9 thus can receive and retain the permanent magnet 2 and rotates said permanent magnet. The arm 9 is made of a non-magnetic material and the motor 8 is far enough away from the permanent magnet 2 and from the magnetometer M so as not to cause any disruption to the measured magnetic field. By way of a variation, the device 1 may not comprise a motor 8 and can be adapted so that the rotation of the arm 9 is performed manually.

Figure 2:
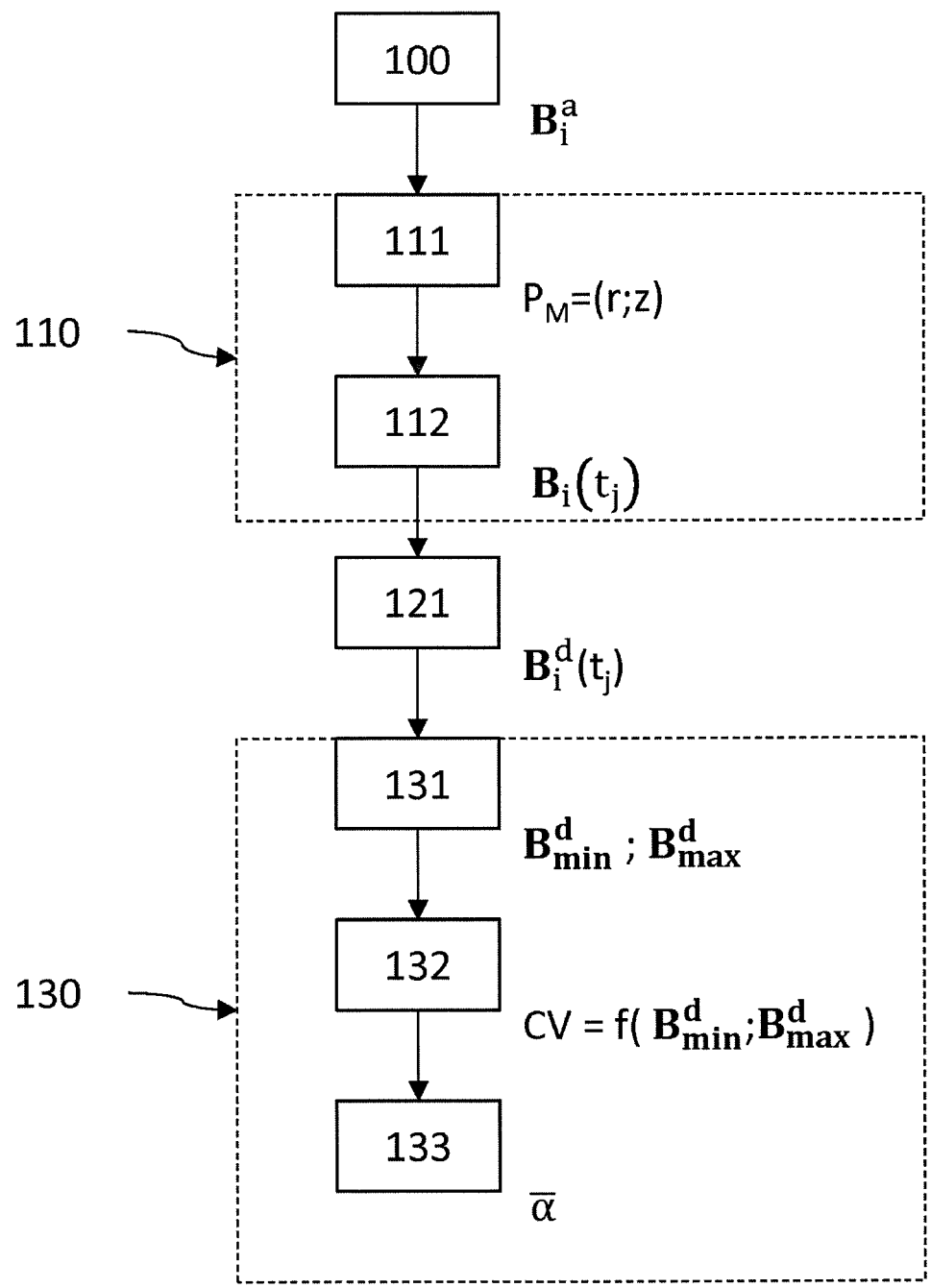
FIG. 2 is a flowchart of an example of a method for estimating a mean angular deviation of the magnetic object according to the first embodiment.

FIG. 2 shows a flowchart of an example of a method for estimating the angular deviation $\overline{\alpha}$ exhibited by the magnetic object 2, with the method being implemented by the estimation device of FIG. 1.

The method comprises a step 100 of previously measuring the ambient magnetic field $B^a$, i.e. in this case the magnetic field not disrupted by the presence of the magnet 2. To this end, the magnetometer M is positioned at its measurement position $P_M$ and measures the magnetic field $B_i^a$ in the absence of the magnet 2, i.e. the acquisition of the projection of the magnetic field $B^a$ on each of the acquisition axes $d_1$, $d_2$, $d_3$.

The method then comprises a step no of measuring the magnetic field B disrupted by the magnet 2 rotating about its reference axis $A_{ref}$ throughout a measurement duration T.

To this end, during a sub-step in, the permanent magnet 2 is positioned by the retention and rotation component 7 at the position $P_o$ facing the magnetometer M, such that the axis of rotation coincides with the reference axis $A_{ref}$ of the magnet 2. The magnetic moment m of the permanent magnet 2 is not co-linear to the reference axis $A_{ref}$ and forms, with respect to this axis, an angular deviation $\overline{\alpha}$ to be determined.

During a sub-step 112, the permanent magnet 2 is rotated by the component 7 about the reference axis $A_{ref}$. The reference axis $A_{ref}$ is static throughout the measurement duration T, in other words its position and its orientation in the coordinate system ($e_r$, $e_θ$, $e_z$) do not vary during the duration T. The rotation speed of the permanent magnet 2, denoted $\dot{\theta}$, is preferably constant throughout the duration T.

Throughout the rotation, during the duration $T=[t_1; t_N]$, a single tri-axis magnetometer M measures the magnetic field B disrupted by the presence of the permanent magnet 2, at a sampling frequency fe=N/T. N measurement instants $t_j$ are thus obtained. The magnetometer M, at the instant $t_j$, measures the projection of the magnetic vector field B along the acquisition axes $d_1$, $d_2$, $d_3$. A time series $\{B(t_j)\}_N$ of N measurements of the disrupted magnetic field B is thus obtained.

The method then comprises a step 130 of estimating the magnetic angular deviation $\overline{\alpha}$ of the permanent magnet 2 from the measurements $B(t_j)$ of the disrupted magnetic field B.

Previously, during a sub-step 121, the computation unit 4 deduces the magnetic field $B^d(t_j)$ generated by the permanent magnet 2, at each instant $t_j$, from the measurements of the ambient magnetic field $B^a$ and of the disrupted magnetic field $B(t_j)$. To this end, $B^d(t_j)=B(t_j)-B^a$ is computed. A time series $\{B^d(t_j)\}_N$ is thus obtained of N measurements of the generated magnetic field $B^d$.

During a sub-step 131, the computation unit 4 identifies a magnetic field, called minimum magnetic field $B_{min}^d$, and a magnetic field, called maximum magnetic field $B_{max}^d$, from the measurements $B^d(t_j)$ of the magnetic field $B^d$. To this end, the norm $\|B^d(t_j)\|$ of each measurement $B^d(t_j)$ of the generated magnetic field $B^d$ is computed, then the minimum field $B_{min}^d$ is identified as being that for which the norm is smallest, i.e. $B_{min}^d$ such that $\|B_{min}^d\|=\min(\{\|B^d(t_j)\|\})$, and the maximum field $B_{max}^d$ is identified as being that for which the norm is largest, i.e. $B_{max}^d$ such that $\|B_{max}^d\|$=max ({$\|B^d(t_j)\|$}). The minimum $B_{min}^d$ and maximum $B_{max}^d$ magnetic fields are thus obtained.

These sub-steps 121 of subtracting the ambient magnetic field $B^a$ and 131 of identifying the minimum $B_{min}^d$ and maximum $B_{max}^d$ magnetic fields can be performed continuously, during the sub-step 112 of acquiring the measurements of the magnetic field B.

During the sub-steps 132 and 133, the computation unit then computes the angular deviation $\bar{\alpha}$ from the identified minimum $B_{min}^d$ in and maximum $B_{max}^d$ fields, and from geometric parameters representing the position $P_M$ of the magnetometer facing the magnet 2.

Figure 3A:
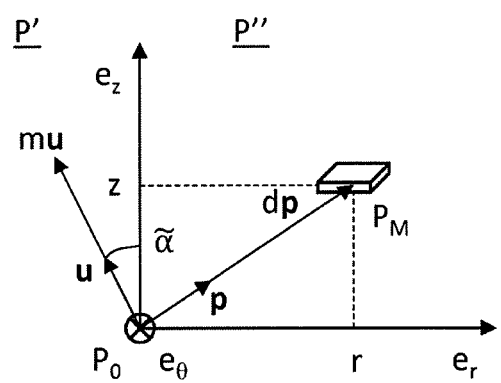
FIGS. 3A and 3B show the rotation instants where the magnetic moment of the object is contained in a plane defined by the reference axis and the position of the magnetometer, and, more specifically, when the magnetic moment is contained in the half-plane not containing the magnetometer (FIG. 3A) and when it is contained in this half-plane (FIG. 3B)
Figure 3B:
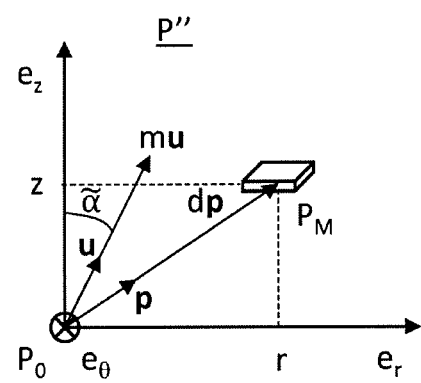

As shown in FIGS. 3A and 3B, it appears that the minimum $B_{min}^d$ in and maximum $B_{max}^d$ fields are associated with the magnetic moment m when this moment belongs to a plane $P=(A_{ref}, P_M)$ of the coordinate system $(e_r, e_\theta, e_z)$ containing the reference axis $A_{ref}$ and passing through the position $P_M$ of the magnetometer.

More specifically, the minimum field $B_{min}^d$ in is associated with the magnetic moment m when said moment belongs to the half-plane P' of the plane P defined by the reference axis $A_{ref}$ and not containing the magnetometer $P_M$ (FIG. 3A). Furthermore, the maximum field $B_{max}^d$ is associated with the magnetic moment m belonging to the half-plane P" of the plane P defined by the reference axis $A_{ref}$ and containing the magnetometer $P_M$ (FIG. 3B).

The minimum $B_{min}^d$ in and maximum $B_{max}^d$ ax fields can be expressed analytically, within the context of the dipolar hypothesis. Indeed, the magnetic field $B^d$ generated by the magnet 2, when it belongs to the plane P of the coordinate system $(e_r, e_{p74}, e_z)$, can be expressed using the following equation (1):

$$B^d(r, z) = 10^{-1} + \frac{m}{d^3}(3(u \cdot p)p - u), \quad (1)$$

where the magnetic moment m=mu is expressed as the product of an amplitude m and of a directional unit vector u, and where the position vector $P_M$-$P_o$=dp of the magnetometer M in the plane $(e_r, e_z)$ is expressed as the product of a distance d and of a directional unit vector p, with the magnetic field in this case being expressed in microtesla.

From the equation (1), the minimum field $B_{min}^d$, associated with the moment m contained in the half-plane P' can be expressed analytically using the following equation (2):

$$B_{min}^d(\bar{\alpha}, r, z) = \frac{0,3\,m}{d^5}\begin{pmatrix} \sin(\bar{\alpha})\frac{d^2}{3} - \sin(\bar{\alpha})r^2 + \cos(\bar{\alpha})rz \\ -\cos(\bar{\alpha})\frac{d^2}{3} + \cos(\bar{\alpha})z^2 - \sin(\bar{\alpha})rz \end{pmatrix}, \quad (2)$$

where (r, z) are the coordinates $P_M$ of the magnetometer M in the plane P relative to the magnet 2, with r being the coordinate along an axis orthogonal to the reference axis $A_{ref}$ and z being the coordinate along an axis parallel to the reference axis $A_{ref}$, and where $d=\sqrt{r^2+z^2}$ is the distance between the magnetometer and the magnetic object.

Similarly, from the equation (1), the maximum field $B_{max}^d$ associated with the moment m contained in the half-plane P" can be expressed analytically using the following equation (3):

$$B_{max}^d(\bar{\alpha}, r, z) = \frac{0.3\,m}{d^5}\begin{pmatrix} -\sin(\bar{\alpha})\frac{d^2}{3} + \sin(\bar{\alpha})r^2 + \cos(\bar{\alpha})rz \\ -\cos(\bar{\alpha})\frac{d^2}{3} + \cos(\bar{\alpha})z^2 + \sin(\bar{\alpha})rz \end{pmatrix}. \quad (3)$$

During a sub-step 132, based on equations (2) and (3), it is possible to compute a coefficient CV no longer dependent on the amplitude m of the magnetic moment, but only dependent on the angular deviation $\bar{\alpha}$ and the geometric parameters representing the positioning of the magnetometer M relative to the magnet 2 in the plane P.

This coefficient CV advantageously is a coefficient, called variation coefficient, which in this case is expressed as the ratio of the norm of the vector formed by the subtraction of the minimum field $B_{min}^d$ ($\bar{\alpha}$,r,z) and the maximum field $B_{max}^d$ ($\bar{\alpha}$,r,z) to the norm of the vector formed by the addition of the minimum $B_{min}^d$ in ($\bar{\alpha}$,r,z) and the maximum $B_{max}^d$ ($\bar{\alpha}$,r,z) fields, as expressed analytically using the following equation (4):

$$CV = \frac{\|B_{max}^d(\bar{\alpha}, r, z) - B_{min}^d(\bar{\alpha}, r, z)\|}{\|B_{max}^d(\bar{\alpha}, r, z) + B_{min}^d(\bar{\alpha}, r, z)\|} = \frac{\sin\bar{\alpha}}{\cos\bar{\alpha}}\left(\frac{\sqrt{r^2z^2 + (r^2 - d^2/3)^2}}{\sqrt{r^2z^2 + (z^2 - d^2/3)^2}}\right). \quad (4)$$

It thus appears that the variation coefficient CV no longer depends on the amplitude m of the magnetic moment and that it is formed by the product of a first term that is only dependent on the angular deviation $\bar{\alpha}$ and of a second term that is only dependent on known geometric parameters, such as the coordinates (r, z) of the magnetometer M in the plane P and the distance d separating the magnetometer M from the magnet 2.

Furthermore, the variation coefficient CV also can be computed from the previously identified minimum $B_{min}^d$ in and maximum $B_{max}^d$ magnetic fields, as expressed using the following relation:

$$CV = \frac{\|B_{max}^d - B_{min}^d\|}{\|B_{max}^d + B_{min}^d\|}. \quad (5)$$

Moreover, during a sub-step 133, the angular deviation $\bar{\alpha}$ can be estimated using the following equation (6), which is obtained from equations (4) and (5):

$$\bar{A} = \tan^{-1}\left(\left(\frac{\|B_{max}^d - B_{min}^d\|}{\|B_{max}^d + B_{min}^d\|}\right) \cdot \left(\frac{\sqrt{r^2z^2 + (z^2 - d^2/3)^2}}{\sqrt{r^2z^2 + (r^2 - d^2/3)^2}}\right)\right). \quad (6)$$

Thus, the estimation method according to this first embodiment allows the angular deviation $\bar{\alpha}$ of the magnetic object 2 to be simply estimated on the basis of a simplified analytical model of the magnetic field $B^d$ generated by the magnet 2 associated with the measurements $B^d(t_j)$ of the magnetic field $B^d$ generated by the magnet 2 and with the geometric parameters representing the position of the magnetometer in a coordinate system in which an axis is co-linear to the axis of rotation, which coincides with the reference axis $A_{ref}$ of the object 2. Thus, the amplitude and the orientation of the magnetic moment do not need to be determined, and this method is also independent of the orientation of the magnetic sensor. Furthermore, it is not limited to low angular deviation values. Furthermore, it only requires the use of at least one tri-axis magnetometer and advantageously of a single tri-axis magnetometer.

Preferably, the magnetometer M is positioned relative to the magnet 2 so that the coordinate z of the magnetometer in the plane P is greater than or substantially equal to the coordinate r. The coordinates r and z advantageously are substantially equal, thus allowing the precision of the estimation of the angular deviation $\bar{\alpha}$ to be improved.

Furthermore, the magnetometer M is preferably located outside the reference axis $A_{ref}$ corresponding to the axis of rotation of the magnet 2, and outside the axis orthogonal to the reference axis $A_{ref}$ and passing through the position $P_o$ of the magnet 2. This arrangement allows the minimum $B_{min}^d$ and maximum $B_{max}^d$ magnetic fields to be clearly distinguished from each other. Furthermore, in order to obtain a good signal-to-noise ratio, the magnetometer is arranged facing the magnet 2 outside the deviation cone formed by the rotating magnetic moment m.

By way of a variation, a plurality of magnetometers $M_i$ can be used to estimate the angular deviation $\bar{\alpha}$. According to one approach, the estimation method can be performed for each magnetometer, in order to obtain a plurality of values $\bar{\alpha}_1$ of the angular deviation $\bar{\alpha}$, each of which is associated with a magnetometer Mi. The angular deviation $\bar{\alpha}$ is then computed by determining a mean, in a weighted or non-weighted manner, of the obtained values $\bar{\alpha}_1$. The mean advantageously is weighted as a function of the intensity of the signal received by each magnetometer.

By way of a variation of the previously described analytical approach, it is possible to estimate the angular deviation from the fields $B_{min}^d$ in and $B_{max}^d$ identified during the sub-step 131, using a plurality of magnetometers that are distinct from each other in terms of positioning. Thus, if the magnetic sensor comprises a plurality of tri-axis magnetometers, the estimate of the angular deviation $\bar{\alpha}$ can be obtained by optimization, by minimizing, for example, the square error between the fields $B_{min,i}^d$ and $B_{max,i}^d$ previously identified by each magnetometer $M_i$ and the minimum $\widetilde{B_{min,1}^d}(\hat{\alpha},\hat{m},r_1,z_1)$ and maximum $\widetilde{B_{max,1}^d}(\hat{\alpha},\hat{m},r_1,z_1)$ fields expressed by equations (2) and (3). In this case, the intention is to resolve the minimization problem formalized using the following expression:

$$\min_{\hat{\alpha},\hat{m}}\left(\sum W_i\left(\left(\widetilde{B_{max,i}^d}(\hat{\alpha},\hat{m},r_i,z_i)-B_{max,i}\right)^2+\left(\widetilde{B_{min,i}^d}(\hat{\alpha},\hat{m},r_i,z_i)-B_{min,i}\right)^2\right)\right),$$

where $\hat{\alpha}$ is the estimated value of the angular deviation, $\hat{m}$ is the estimated amplitude of the magnetic moment, and where $r_i$ and $z_i$ are the coordinates of each magnetometer $M_i$. The term $W_i$ in this case is a weighting term, for example dependent on the inverse of the noise associated with each magnetometer $M_i$. Similarly, this expression of minimization can be adapted to the case in which the magnetic sensor comprises a plurality of scalar magnetometers that measure the norm of the magnetic field. In this case, the square error is minimized between the norm of the magnetic fields. These examples are provided solely by way of an illustration and other approaches are possible.

Furthermore, preferably, the sampling frequency, the direction and/or the rotation speed are selected so as to improve the quality of the estimate of the angular deviation $\bar{\alpha}$, and, more specifically, the identification of the minimum $B_{min}^d$ and maximum $B_{max}^d$ magnetic fields. Thus, when the sub-step 131 of identifying the fields $B_{min}^d$ and $B_{max}^d$ is performed during the sub-step 112 of acquiring the measurements of the field B, the rotation of the magnet 2 can comprise a reduction in the rotation speed and/or an increase in the sampling frequency to be measured when approaching the minimum $\min(\{\|B^d(t_j)\|\})$ and maximum $\max(\{\|B^d(t_j)\|\})$ values of the norm of the generated magnetic field $B^d$. The rotation of the magnet 2 can also comprise oscillation phases, i.e. changes in the direction of rotation, around these values. The relative uncertainty associated with the minimum and maximum values is thus reduced, which allows the quality of the identification of the minimum $B_{min}^d$ in and maximum $B_{max}^d$ magnetic fields, and thus of the estimation of the angular deviation $\alpha$, to be improved.

Furthermore, within the context of a method for characterizing the magnetic object, it can be advantageous for the amplitude m of the magnetic moment m to also be determined, herein in the advantageous case where a single tri-axis magnetometer is used.

The amplitude m thus can be determined from the estimated angular deviation $\bar{\alpha}$, of the identified maximum magnetic field $B_{max}^d$, and from said geometric parameters, namely the coordinates (r, z) of the magnetometer M and the distance d between said magnetometer and the magnet 2.

More specifically, the amplitude m of the magnetic moment m can be computed from the ratio between the norm $\|B_{max}^d\|$ of the identified maximum magnetic field $B_{max}^d$ and the norm $\|\hat{B}_{max}^d(\bar{\alpha},r,z)\|$ of the maximum magnetic field $\hat{B}_{max}^d(\bar{\alpha},r,z)$ for a unitary amplitude of said magnetic moment m, expressed analytically using the equation (7) resulting from the equation (3):

$$\hat{B}_{max}^d(\bar{\alpha},r,z)=\frac{0.3}{d^5}\begin{pmatrix}-\sin(\bar{\alpha})\frac{d^2}{3}+\sin(\bar{\alpha})r^2+\cos(\bar{\alpha})rz\\-\cos(\bar{\alpha})\frac{d^2}{3}+\cos(\bar{\alpha})z^2+\sin(\bar{\alpha})rz\end{pmatrix}, \quad (7)$$

where $\bar{\alpha}$ is the previously estimated angular deviation and (r, z) and d are the known geometric parameters.

The amplitude m is thus computed from the following equation (8):

$$M=\frac{\|B_{max}^d\|}{\|B_{max}^d(\bar{\alpha},r,z)\|}, \quad (8)$$

which then allows the magnet 2 to be characterized by the value of the amplitude m, on the one hand, and by the value of the angular deviation $\bar{\alpha}$, on the other hand.

By way of a variation, the amplitude m can be computed from the identified minimum magnetic field $B_{min}^d$ in and by its analytical expression of the equation (2). The use of the maximum magnetic field $B_{max}^d$ nevertheless allows better precision to be obtained.

Figure 4A:
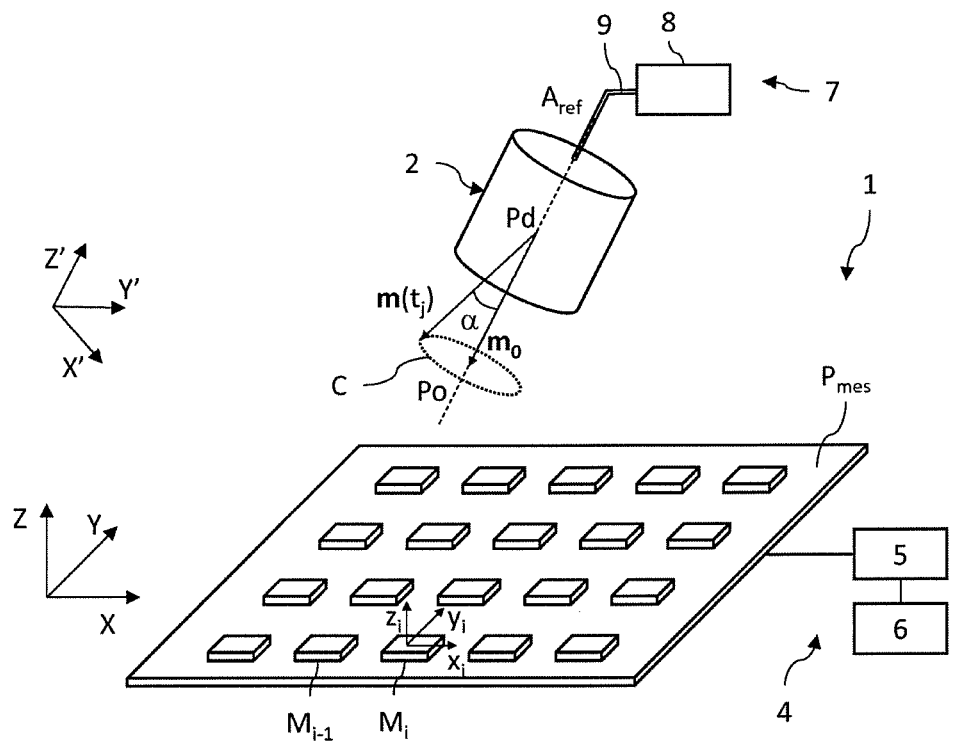
FIG. 4A is a schematic perspective view of a device for estimating a mean angular deviation of a magnetic object according to a second embodiment, and FIG. 4B schematically shows the time evolution of the magnetic moment of the magnetic object during a measurement duration T, thus forming a circle that extends around the reference axis.

FIG. 4A is a schematic and partial perspective view of a device 1 for estimating an angular deviation, called mean angular deviation $\bar{\alpha}$, of a magnetic object 2, according to a second embodiment, the magnetic object in this case being a cylindrical, for example annular, permanent magnet. In this case, instantaneous magnetic moment refers to the magnetic moment vector estimated at a given instant, and instantaneous angular deviation refers to the value of the angular deviation estimated at a given instant.

The estimation device 1 is capable of estimating the instantaneous magnetic moment at different measurement instants throughout a measurement duration T, in an XYZ coordinate system. More specifically, the device 1 allows the position of the permanent magnet 2, and its magnetic moment, to be estimated at different instants, in the XYZ coordinate system. In other words, the device 1 allows the position and the orientation of the permanent magnet 2 to be located at different instants in the XYZ coordinate system.

In this case, and throughout the remainder of the description, a direct three-dimensional coordinate system (X, Y, Z) is defined where the axes X and Y form a plane parallel to the measurement plane of the array of magnetometers, and where the axis Z is oriented substantially orthogonal to the measurement plane. Throughout the remainder of the description, the terms "vertical" and "vertically" are understood to be relating to an orientation substantially parallel to the Z axis, and the terms "horizontal" and "horizontally" are understood to be relating to an orientation substantially parallel to the plane (X, Y). Furthermore, the terms "lower" and "upper" are understood to be relating to a growing position when moving away from the measurement plane in the direction +Z.

The position $P_d$ of the permanent magnet 2 corresponds to the coordinates of the geometric center of the magnet 2. The geometric center is the unweighted barycenter of all the points of the permanent magnet 2. The magnetic moment m of the magnet 2 has the components $(m_x, m_y, m_z)$ in the XYZ coordinate system. Its norm, or intensity, is denoted $\|m\|$.

The device 1 comprises an array of magnetometers $M_i$ distributed facing each other so as to form a measurement plane $P_{mes}$. The number of magnetometers $M_i$ can be, for example, greater than or equal to 2, preferably greater than or equal to 16, for example, equal to 32, particularly when tri-axis magnetometers are involved. The array of magnetometers nevertheless comprises at least 3 measurement axes that are remote from each other and are not parallel in pairs.

The magnetometers $M_i$ are attached to a protection plate 3 and can be located on the rear face of the plate 3, which is produced from a non-magnetic material. The term attached is understood to mean that they are assembled on the plate 3 without any degree of freedom. In this case, they are aligned in rows and columns, but can be mutually positioned in a substantially random manner. The distances between each magnetometer and its neighbors are known and constant over time. For example, they can be between 1 cm and 4 cm.

The magnetometers $M_i$ each have at least one measurement axis, for example three axes, denoted $x_i, y_i, z_i$. Each magnetometer therefore measures the amplitude and the direction of the magnetic field B disrupted by the permanent magnet. More specifically, each magnetometer $M_i$ measures the norm of the orthogonal projection of the magnetic field B along the axes $x_i, y_i, z_i$ of the magnetometer. The sensitivity of the magnetometers $M_i$ can be $4.10^{-7}$ T. The term disrupted magnetic field B is understood to be the ambient magnetic field $B^a$, i.e. not disrupted by the magnet, to which the magnetic field $B^d$ generated by the magnet is added.

The estimation device 1 further comprises a computation unit 4 able to compute the position and the orientation of the magnetic moment of the magnet 2 in the XYZ coordinate system from the measurements of the magnetometers $M_i$. It also allows the mean angular deviation of the permanent magnet 2 to be determined from the measurements of the magnetic moment.

To this end, each magnetometer $M_i$ is electrically connected to the computation unit 4 using an information transmission bus (not shown). The computation unit 4 comprises a programmable processor 5 able to execute instructions stored on an information recording medium. It further comprises a memory 6 containing the instructions required to implement certain steps of a method for estimating the mean angular deviation using the processor 5. The memory 6 is also adapted to store the information computed at each measurement instant.

The computation unit 4 implements a mathematical model associating the position of the permanent magnet 2 in the XYZ coordinate system, as well as the orientation and the intensity of the magnetic moment, with the measurements of the magnetometers M. This mathematical model is constructed from the equations of the electromagnetism, particularly the magnetostatic, and is particularly configure d using the positions and orientations of the magnetometers in the XYZ coordinate system.

Preferably, in order to be able to approximate the permanent magnet 2 with a magnetic dipole, the distance between the permanent magnet 2 and each magnetometer $M_i$ is greater than 2, and even 3 times the largest dimension of the permanent magnet 2. This dimension can be less than 20 cm, even less than 10 cm, even less than 5 cm.

The estimation device 1 also comprises a retention and rotation component 7 capable of retaining the permanent magnet 2 facing the measurement plane, in any position facing the measurement plane. The permanent magnet can be located above, i.e. facing, the array of magnetometers $M_i$, in a vertical position along the Z axis that is constant during the measurement duration T. It is also capable of rotating the magnet 2 along its reference axis $A_{ref}$ during the measurement duration. Furthermore, during the measurement duration, the vertical position of the permanent magnet 2 is fixed and only its angular position varies due to the rotation along the reference axis $A_{ref}$. The retention and rotation component 7 comprises a motor 8 connected to an arm 9. The arm 9 thus can receive and retain the permanent magnet 2 and rotates said permanent magnet. The arm 9 is made of a non-magnetic material and the motor 8 is far enough away from the measurement plane $P_{mes}$ and the permanent magnet 2 so as not to disrupt the measured magnetic field.

Figure 5:
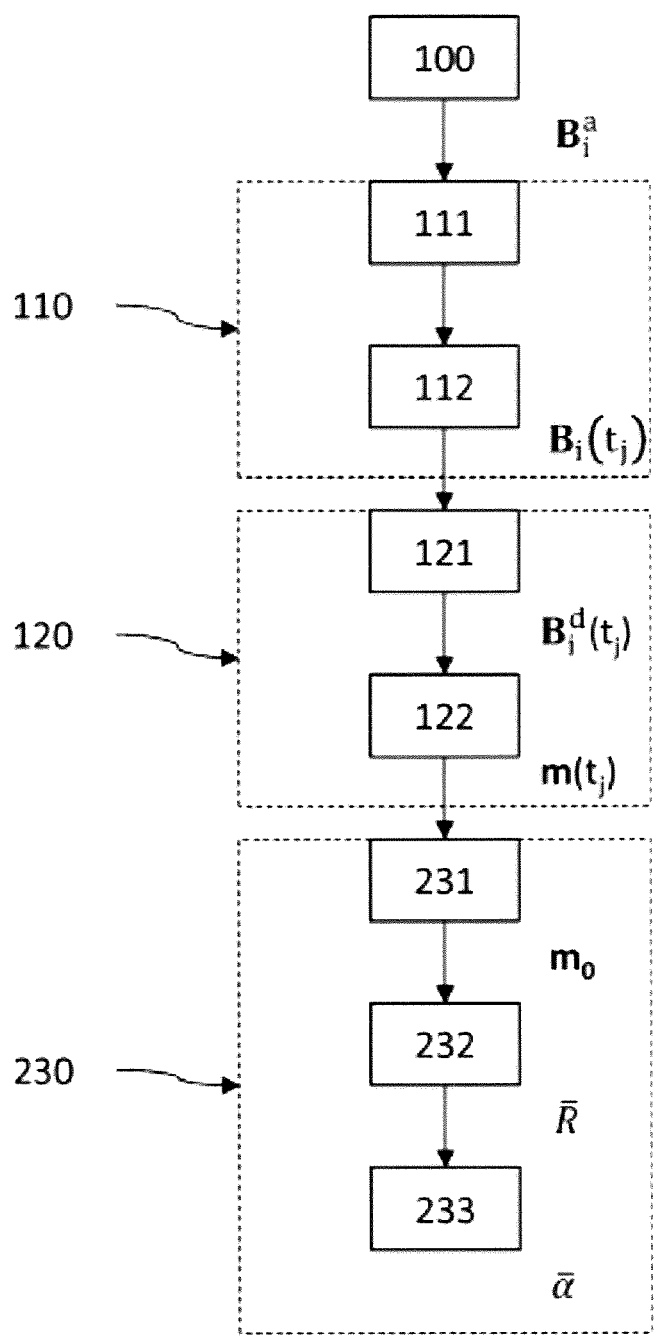
FIG. 5 is a flowchart of an example of a method for estimating a mean angular deviation of the magnetic object according to the second embodiment.

FIG. 5 is a flowchart of an example of a method for estimating the mean angular deviation exhibited by a magnetic object, the method being implemented by the estimation device of FIG. 4A.

The method comprises a step 100 of previously measuring the ambient magnetic field $B^a$, i.e. in this case the magnetic field not disrupted by the presence of the magnet 2. To this end, each magnetometer $M_i$ measures the magnetic field $B_i^a$ in the absence of the magnet 2, i.e. the projection of the magnetic field $B^a$ on each acquisition axis $x_i, y_i, z_i$ of the various magnetometers $M_i$.

The method then comprises a step 110 of measuring the magnetic field disrupted by the magnet 2 rotating about its reference axis $A_{ref}$ throughout a measurement duration T.

During a sub-step in, the permanent magnet 2 is positioned facing the measurement plane Pines using the retention and rotation component 7, which defines the orientation of the reference axis $A_{ref}$ of the permanent magnet 2 facing the measurement plane $P_{mes}$ in the XYZ coordinate system. In this example, the permanent magnet 2 is positioned above the measurement plane Pines, but any other position is possible. The axis $A_{ref}$ can be oriented in any manner, but advantageously can be oriented substantially orthogonal to the measurement plane $P_{mes}$. The magnetic moment m of the permanent magnet 2 is not co-linear to the reference axis $A_{ref}$ and forms, with respect to this axis, an angular deviation $\alpha$ to be determined.

During a sub-step 112, the permanent magnet 2 is rotated by the component 7 about the reference axis $A_{ref}$. The reference axis $A_{ref}$ is static throughout the measurement duration T, in other words its position and its orientation in the XYZ coordinate system do not vary during the duration T. The rotation speed of the permanent magnet 2, denoted $\dot{\theta}$, is preferably constant throughout the duration T.

Throughout the rotation, during the duration $T=[t_1; t_N]$, each magnetometer $M_i$ measures the magnetic field $B_i(t_j)$ disrupted by the presence of the permanent magnet 2, at a sampling frequency fe=N/T. N measurement instants $t_j$ are thus obtained. Each magnetometer $M_i$ at the instant measures the projection of the magnetic field B along the one or more acquisition axis/axes $x_i$, $y_i$, $z_i$. A time series $\{B_i(t_j)\}_N$ of N measurements of the disrupted magnetic field is thus obtained.

The method subsequently comprises a step 120 of estimating the instantaneous magnetic moment $m(t_j)$ of the permanent magnet 2, for each measurement instant $t_j$, from the measurements of the disrupted magnetic field $B_i(t_j)$.

During a sub-step 121, the computation unit 4 deduces the magnetic field $B_i^d(t_j)$ generated by the permanent magnet 2, for each magnetometer $M_i$ and at each instant $t_j$, from measurements of the ambient magnetic field $B_i^a$ and of the disrupted magnetic field $B_i(t_j)$. To this end, $B_i^d(t_j)=B_i(t_j)-B_i^a$ is computed.

During a sub-step 122, the computation unit 4 estimates the position $P_d$ of the permanent magnet 2, as well as its instantaneous magnetic moment $m(t_j)$, at each instant $t_j$, from the previously computed magnetic field $B_i^d(t_j)$. To this end, the computation unit 4 addresses a mathematical model of equations of the electromagnetism associating the position and the magnetic moment of the permanent magnet 2 with the magnetic field that it generates $B_i^d(t_j)=f(P_d; m(t_j))$. Thus, at each measurement instant, the computation unit 4 determines the coordinates of the position of the permanent magnet 2, as well as the components $m_x$, $m_y$, $m_z$ of the instantaneous magnetic moment, in the XYZ coordinate system. A time series $\{m(t_j)\}_N$ of N instantaneous vectors of the magnetic moment $m(t_j)$ is thus obtained.

Figure 4B:
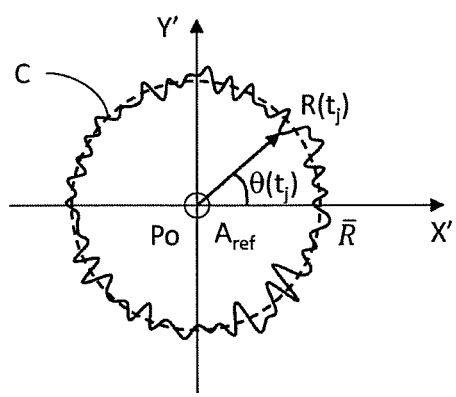

As shown in FIGS. 4A and 4B, the time series $\{m(t_j)\}_N$ forms a circle C that extends around the reference axis $A_{ref}$. The circle C can be associated with the instantaneous radii $R(t_j)$ that relate to the instantaneous magnetic moments $m(t_j)$, as well as with a mean radius $\bar{R}$, the value of which depends on the mean angular deviation $\bar{\alpha}$ to be determined.

The method then comprises a step 230 of estimating the mean angular deviation $\bar{\alpha}$ formed by the angular difference between the magnetic moment m of the magnetic dipole and the reference axis $A_{ref}$.

During a sub-step 231, the computation unit estimates an invariant vector $m_o$ during the rotation of the permanent magnet 2. To this end, the time mean is determined, on the N measurement instants $t_j$, for each coordinate $m_x(t_j)$, $m_y(t_j)$, $m_z(t_j)$ of the instantaneous magnetic moment $m(t_j)$ in the XYZ coordinate system. Thus, $m_o=(<m_x(t_j)>_N; <m_y(t_j)>_N; <m_z(t_j)>_N)=<m(t_j)>_N$. The operator $<>_N$ in this case corresponds to the arithmetical time mean, which is optionally weighted, on the N measurement instants. A vector $m_o$ is thus obtained that is substantially co-linear to the reference axis $A_{ref}$, which extends between the position Pa of the magnet 2 and the position $P_o$ of the center of the circle C.

During a sub-step 232, the computation unit estimates a parameter representing a mean amplitude of the angular difference of the instantaneous magnetic moments relative to the reference axis. In this case, this parameter is the mean radius $\bar{R}$ of the circle C, such that $\bar{R}=<\|m(t_j)-m_0\|>_N$, i.e. the time mean of the norm of the instantaneous vectors $m(t_j)-m_o$.

During a sub-step 233, the unit determines the mean angular deviation $\bar{\alpha}$ from the estimated mean radius $\bar{R}$ and, in this example, from the invariant vector $m_o$. To this end, it computes the arctangent of the ratio of the mean radius $\bar{R}$ to the norm of the invariant vector $m_o$: $\bar{\alpha}=\tan^{-1}(\bar{R}/\|m_o\|)$. An estimate is thus obtained of the angular deviation $\bar{\alpha}$ between the reference axis of the magnetic object and its magnetic axis.

Of course, other equivalent computations can be performed. Thus, by way of a variation, during the sub-step 233, the estimate of the mean angular deviation can be obtained from the arcsine of the ratio between the previously estimated mean radius $\bar{R}$ and the time mean of the norm of the instantaneous magnetic moment $<|m(t_j)|>_N$ on the N measurement instants $t_j$.

It is also possible, by way of a variation, to estimate, during the sub-step 232, the instantaneous radius $R(t_j)$ of the circle at each measurement instant $t_j$ and to compute, during the sub-step 233, the corresponding instantaneous angular deviation $\alpha(t_j)$, then to determine the mean angular deviation $\bar{\alpha}$ as being the time mean $<\alpha(t_j)>_N$ of the instantaneous angular deviations on the N measurement instants $t_j$.

It is also possible, by way of a variation, to estimate, during the sub-step 232, the mean radius $\bar{R}$ by adjusting at least one parameter of an equation of a circle in the XYZ coordinate system passing through the time series of the instantaneous magnetic moments, for example, the series $\{m(t_j)\}_N$. Thus, the equation of the circle can be $(m_x(t_j)-P_{o,x})^2-(m_y(t_j)-P_{o,y})^2-(m_z(t_j)-P_{o,z})^2=\bar{R}$, where $P_{o,x}$, $P_{o,y}$, $P_{o,z}$ are the coordinates of the center $P_o$ of the circle C deduced from the position $P_d$ of the magnetic moment estimated during the sub-step 122 and of the invariant vector $m_o$ estimated during the sub-step 231, and where $m_x(t_j)$, $m_y(t_j)$, $m_z(t_j)$ are the values of the components of the instantaneous magnetic moment of the considered time series $\{m(t_j)\}_N$. The adjustment of the value of the mean radius $\bar{R}$ can be performed in a known manner, using conventional, for example, multiple linear or polynomial, regression methods.

By way of an example, the magnetic object is a permanent magnet with rotational symmetry about its reference axis $A_{ref}$. It is positioned, for example, 4 cm on the vertical of an array of 32 tri-axis magnetometers with sensitivity of $4.10^{-7}$ T separated by 4 cm, for example. The rotation speed is $\pi/5$ rad/s (1 revolution in 10 seconds) and the sampling frequency is 140 Hz. During a 10 second duration T, the magnetic object completes a single rotation and the determination device acquires 1400 measurement instants. The computation unit estimates, at 0.165 A·m$^2$, the mean intensity of the magnetic moment for an RMS (Root Mean Square) noise of $5.10^{-4}$ A·m$^2$. The determination device estimates, at 0.01°, the mean angular deviation between the reference axis of the magnet and its magnetic axis.

Preferably, the measurement duration T and the rotation speed $\dot{\theta}$ are selected so that, during the duration T, the magnetic object has performed a whole number of complete revolutions, for example a single revolution. Furthermore, in order to obtain a substantially homogeneous angular distribution of the measurement data about the reference axis $A_{ref}$ throughout the duration T, the basic rotation $\Delta\theta_j$ between two measurement instants $t_j$ and $t_{j+1}$ is substantially constant.

As now described, in the event that the measurement data does not exhibit substantially homogeneous angular distribution about the reference axis $A_{ref}$ during the duration T, an angular homogenization step can be implemented.

FIGS. 6A to 6E and FIG. 7 show a step 140 of homogenizing the angular distribution of the instantaneous magnetic moments about the reference axis $A_{ref}$ throughout the measurement duration T. This step is based on re-sampling the instantaneous magnetic moments throughout the measurement duration T by interpolation, in this case by means of a linear interpolation method, so that the angular differences between two successive instantaneous magnetic moments are substantially constant. In other words, an initial time series of N instantaneous magnetic moments is re-sampled, which moments exhibit an inhomogeneous angular distribution about the reference axis $A_{ref}$ during the duration T, for example the time series $\{m(t_j)\}_N$ estimated, for example, during the sub-step 122, in order to obtain a time series, called homogenized series $\{m^h(t_j)\}_{N'}$, of N' instantaneous magnetic moments that exhibit a substantially homogeneous angular distribution.

Figure 6A:
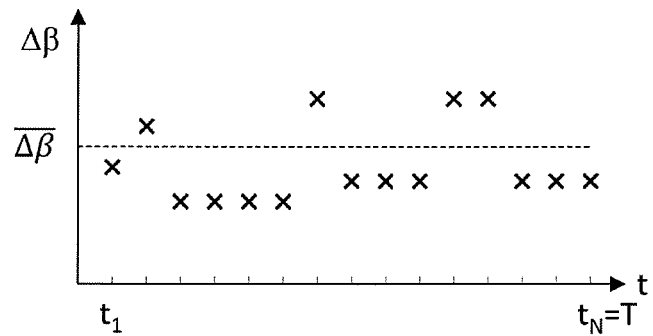
FIG. 6A shows an example of the time evolution of the elementary angular deviation between two successive instantaneous magnetic moments during the measurement duration T.
Figure 6B:
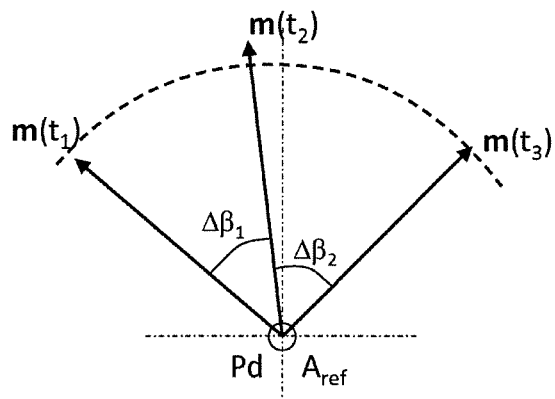
FIGS. 6B and 6C schematically show an example of non-homogeneous angular distribution of the instantaneous magnetic moments about the reference axis.
Figure 6C:
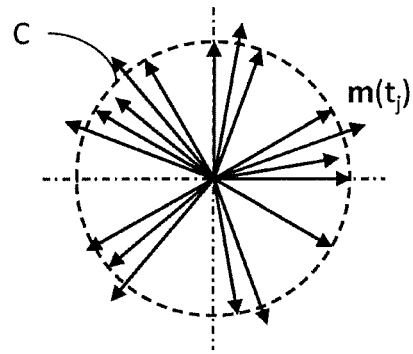

This step is advantageous when, as shown in FIGS. 6A to 6C, the angular distribution of the instantaneous magnetic moments about the reference axis $A_{ref}$ is not homogeneous throughout the duration T. This is expressed by the fact that the angular differences $\Delta\beta_j$ defined between two instantaneous magnetic moments $m(t_j)$ and $m(t_{j+1})$, at successive measurement instants $t_j$ and $t_{j+1}$, exhibit high dispersion around the mean value $\overline{\Delta\beta}$.

In this case, the vector $m_o$, computed during the sub-step 231 described above, may not be rotationally invariant, i.e. may not be co-linear to the reference axis $A_{ref}$. This error in the computation of the vector $m_o$ can introduce a bias on the estimated value of the mean angular deviation $\overline{\alpha}$. This homogenization step 140 thus allows the error in the estimate of the invariant vector $m_o$ to be reduced.

Figure 7:
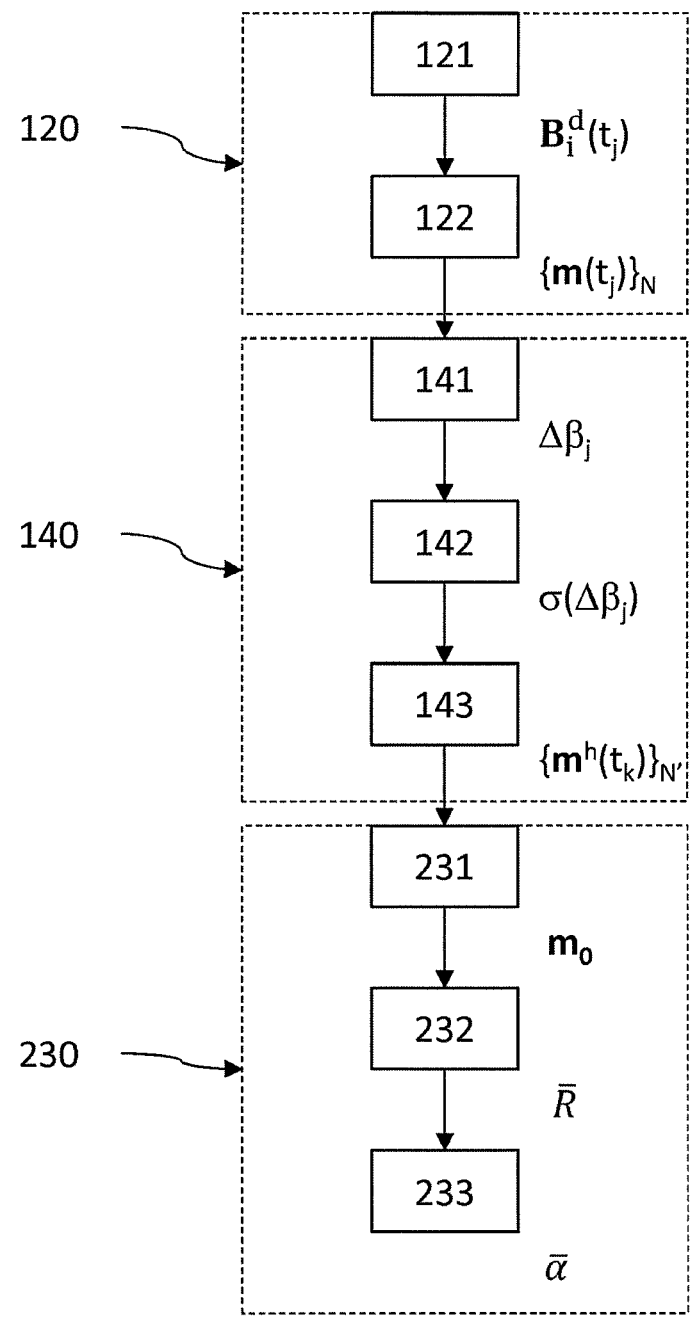
FIG. 7 is a flowchart of a partial example of a method for estimating a mean angular deviation comprising a step of angular homogenization.

With reference to FIG. 7, this homogenization step 140 can comprise an optional sub-step 141, in which the angular differences $\Delta\beta_j$ are firstly estimated that are defined by the estimated magnetic moments $m(t_j)$ and $m(t_{j+1})$ at successive measurement instants of the initial time series, for example $\{m(t_j)\}_N$ in this case. To this end, the angular difference $\Delta\beta_j$ can be computed from the arcsine of the norm of the vector product of these two vectors: $\Delta\beta_j = \sin^{-1}\|m(t_j) \times m(t_{j+1})\|/(\|m(t_j)\| \cdot \|m(t_{j+1})\|)$, where the symbol "x" represents the vector product and the symbol "·" represents the scalar product.

Then, during a sub-step 142 that is also optional, the estimate of the dispersion of the angular differences $\Delta\beta_j$ can be obtained by computing the standard deviation $\sigma_{\Delta\beta}$, or an equivalent parameter, on the estimated angular differences $\Delta\beta_j$. If the value of the standard deviation $\sigma_{\Delta\beta}$ is below a predetermined threshold, the measurement data exhibit a substantially homogeneous angular distribution. Otherwise, the angular distribution of the instantaneous magnetic moments about the reference axis $A_{ref}$ throughout the measurement duration T is homogenized.

During a sub-step 143, the initial time series $\{m(t_j)\}_N$ is re-sampled by interpolation in order to obtain a time series, called homogenized series $\{m^h(t_k)\}_{N'}$, of N' interpolated magnetic moments, the angular differences $\Delta\beta_o$ of which are substantially constant. This involves over-sampling when N'>N, but the number N' can be less than or equal to N.

Figure 6D:
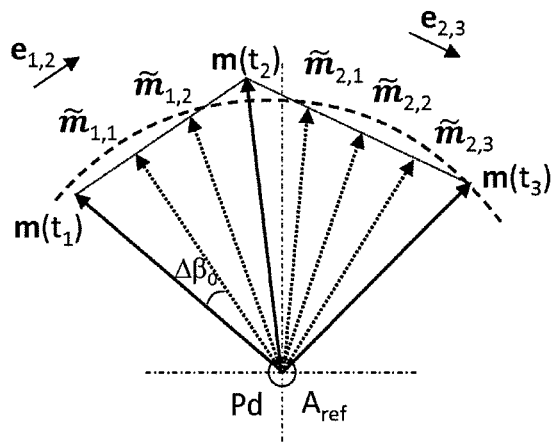
FIGS. 6D and 6E schematically show an example of homogeneous angular distribution, about the reference axis, of the instantaneous magnetic moments obtained after a step of angular homogenization.
Figure 6E:
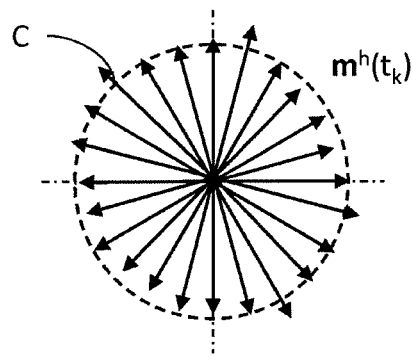

To this end, an approach shown in FIG. 6D involves discretizing the angular difference $\Delta\beta_j$ between two successive instantaneous magnetic moments $m(t_j)$ and $m(t_{j+1})$ of the initial time series $\{m(t_j)\}_N$ when its value is greater than a predetermined threshold value $\Delta\beta_o$, for example, by linear interpolation (as shown in FIG. 6D) or by another interpolation, for example by polynomial interpolation.

Thus, two magnetic moments $m(t_{j+1})$ and $m(t_j)$ are considered that are measured at the successive instants $t_j$ and $t_{j+1}$, the angular difference $\Delta\beta_j$ of which in this case has a value that is greater than the threshold $\Delta\beta_o$. A unit vector $e_{j,j+1} = (m(t_{j+1}) - m(t_j))/|m(t_{j+1}) - m(t_j)|$ is determined. Then, one or more interpolated magnetic moments is/are computed such that: $\tilde{m}_{j,k+1} = \tilde{m}_{j,k} + \Delta\beta_o \cdot e_{j,j+1}$, with $\tilde{m}_{j,k=0} = m(t_j)$. The iteration on k continues as long as the angular deviation between $m(t_{j+1})$ and $\tilde{m}_{j,k+1}$ is greater than $\Delta\beta_o$. By way of an illustration, the magnetic moments $m(t_1)$ and $m(t_2)$ are considered that are measured at the successive instants $t_1$ and $t_2$, for which the angular difference $\Delta\beta_1$ in this case exhibits a value that is greater than the threshold $\Delta\beta_o$. The unit vector $e_{1,2} = (m(t_2) - m(t_1))/\|m(t_2) - m(t_1)\|$ is determined. Then, one or more interpolated magnetic moments is/are computed such that: $\tilde{m}_{1,k+1} = \tilde{m}_{1,k} + \Delta\beta_o \cdot e_{1,2}$, with $\tilde{m}_{1,k=0} = m(t_{j=1})$ and as long as the angular deviation between $m(t_2)$ and $\tilde{m}_{i,k+i}$ is greater than $\Delta\beta_0$. This sub-step 143 can be applied to all the pairs of magnetic moments $m(t_j)$ and $m(t_{j+1})$ measured at successive instants, for which $\Delta\beta_j > \Delta\beta_0$. By way of an example, in FIG. 6D, three interpolated vectors $\tilde{m}_{21}$, $\tilde{m}_{22}$, $\tilde{m}_{23}$ are computed between the instantaneous magnetic moments $m(t_2)$ and $m(t_3)$, such that the angular differences between these magnetic moments $m(t_2)$, $\tilde{m}_{21}$, $\tilde{m}_{22}$, $\tilde{m}_{23}$ and $m(t_3)$ are substantially constant and equal to $\Delta\beta_o$.

Thus, a homogenized time series $\{m^h\}_{N'}$ of N' instantaneous magnetic moments $\{m^h\}_{N'}$ is obtained corresponding to the N magnetic moments of the initial time series $\{m(t_j)\}_N$ estimated during the sub-step 122 to which the interpolated magnetic moments $\tilde{m}$ are added.

By way of a variation (not shown), a homogenized time series $\{m^h\}_{N'}$ can be constructed without having to incorporate, as previously, the initial time series $\{m(t_j)\}_N$ therein. Thus, interpolated magnetic moments N' can be computed such that: $\tilde{m}_{k+1} = \tilde{m}_k + \Delta\beta_0 \cdot e_{j,j+1}$, with $\tilde{m}_{k=o} = m(t_{1=1})$ and with the unit vector $e_{j,j+i} = (m(t_{j+1}) - m(t_j))/\|m(t_{j+1}) - m(t_j)\|$. The iteration on k continues as long as the angular difference between $\tilde{m}_{k+1}$ and $m(t_{j+1})$ is greater than $\Delta\beta_0$, and as long as the product of the number k of iterations and of $\Delta\beta_0$ is less than one or several times $2\pi$. Furthermore, the unit vector $e_{j,j+1}$ is defined as j and j+1 so that the angular differences between $m(t_j)$ and $\tilde{m}_{k+1}$, on the one hand, and between $\tilde{m}_{k+1}$ and $m(t_{j+1})$, on the other hand, are less than the angular deviation $\Delta\beta_j$ between $m(t_j)$ and $m(t_{j+1})$. The homogenized time series $\{m^h\}_{N'}$ is thus obtained of N' interpolated magnetic moments.

Prior to the sub-step 143 of computing the homogenized time series $\{m^h\}_{N'}$, it is possible for over-sampling of the initial time series to be performed, for example, $\{m(t_j)\}_N$, preferably by polynomial interpolation, optionally using splines, to thus obtain a new time series to be homogenized by means of the previously described sub-step 143.

Thus, the standard deviation computed on the angular deviations $\Delta\beta'$ associated with the homogenized time series $\{m^h\}_{N'}$ is then minimal or substantially zero insofar as they are substantially equal to the value $\Delta\beta_o$. The instantaneous magnetic moments $m^h(t_k)$ then exhibit a substantially homogeneous angular distribution about the reference axis $A_{ref}$ throughout the measurement duration T.

The homogenized time series $\{m^h\}_{N'}$ corresponds to re-sampling of the measurement data at a new frequency $fe' = N'/T$, so that each instantaneous magnetic moment $m^h(t_k)$ of the homogenized time series $\{m^h\}_{N'}$ can be viewed as an estimate of the magnetic moment at different measurement instants $t_k$, with $k=\{1, 2, \ldots, N'\}$.

The method for estimating the mean angular deviation $\overline{\alpha}$ between the magnetic axis and the reference axis is then continued with the previously described step 230. During the sub step 231, the invariant vector $m_o$ is deduced from N' instantaneous magnetic moments $m_{h(tk)}$ of the homogenized time series $\{m^h\}_{N'}$ and no longer from the N instantaneous magnetic moments $m(t_j)$ of the time series $\{m\}_N$ obtained during the sub-step 122. Furthermore, during the sub-step 232, the mean radius R of the circle C is computed from the magnetic moments $m^h(t_k)$ of the homogenized time series and/or from the magnetic moments $\hat{m}(t_j)$ of the filtered time series $\{\hat{m}(t_j)\}_N$ described hereafter, and not from the magnetic moments $m(t_j)$ of the time series obtained during the sub-step 122.

As will now be described, it can be advantageous for a step 150 to be performed of low-pass filtering of the components of the instantaneous magnetic moments in the XYZ coordinate system, in order to reduce the time dispersion, in other words, the measurement noise, that they can exhibit, for example, using an arithmetical or exponential moving mean computed on a number K of samples. This is particularly advantageous when the mean angular deviation is less than 0.2° and/or when the noise associated with the components of the magnetic moments is the same order of magnitude as the value of the mean radius R of the circle C.

Figure 8A:
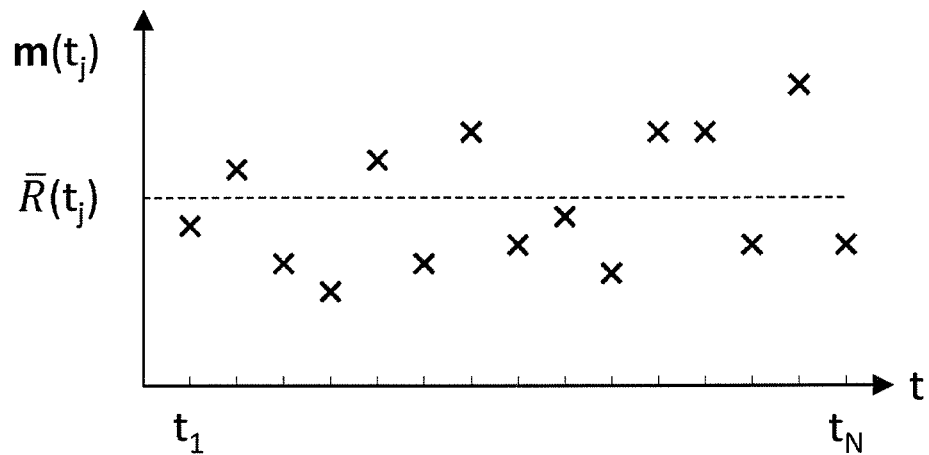
FIG. 8A shows a schematic example of the time evolution of the components of the instantaneous magnetic moment and FIG. 8B shows an example of the evolution of the value of a bias on the estimation of the estimated mean angular deviation, as a function of the value of the actual angular deviation, for different values K of the number of samples taken into account during a filtering step.

FIG. 8A is a diagram that schematically shows the time dispersion of the values of the components $m(t_j)$ of the instantaneous magnetic moments $m(t_j)$ in the XYZ coordinate system, in this case originating from the time series $\{m(t_j)\}_N$ obtained during the sub-step 122.

This dispersion of the values of the components $m(t_j)$ over time can cause a bias in the estimate of the mean angular deviation $\overline{\alpha}$. The bias in this case is denoted b and is defined as the difference between the actual angular deviation $\alpha r$ of the permanent magnet 2 and the mean angular deviation $\overline{\alpha}$, that is $b=\overline{\alpha}-\beta_r$.

Figure 9:
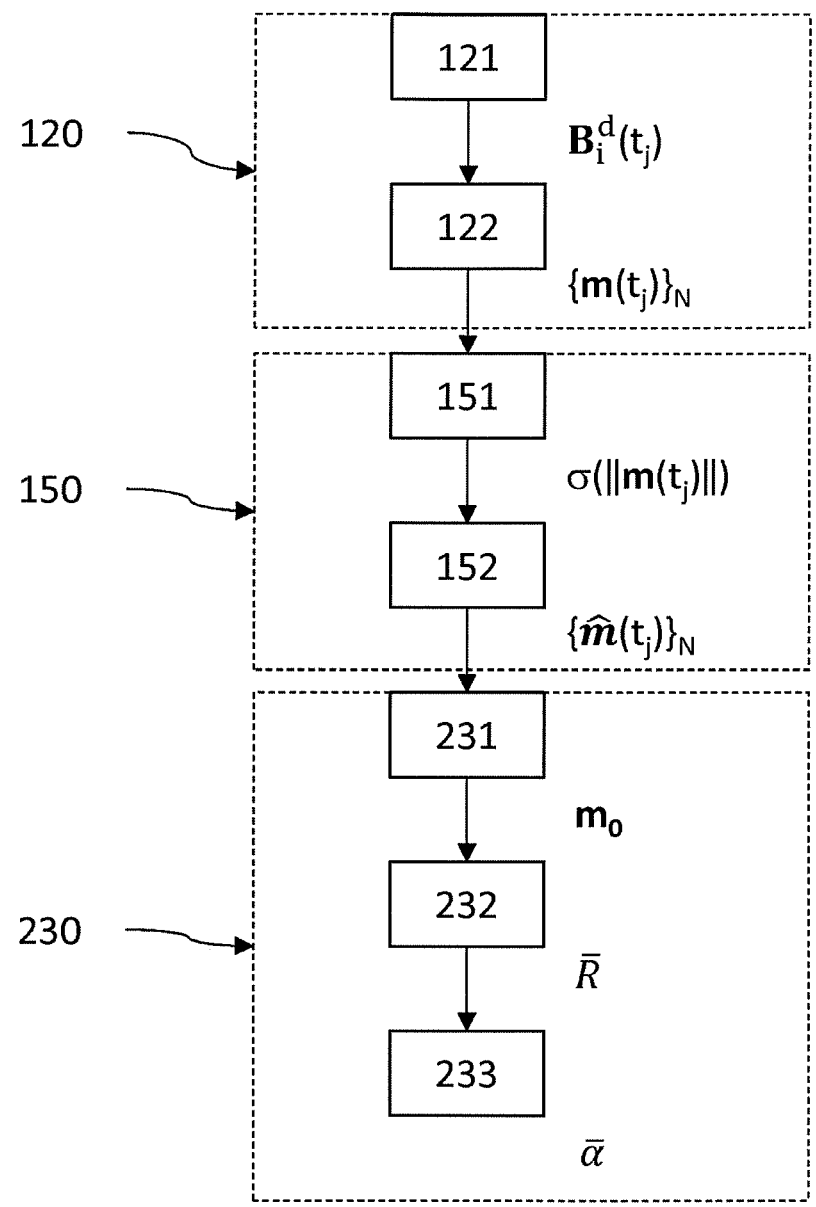
FIG. 9 is a flowchart of a partial example of a method for estimating a mean angular deviation comprising a step of filtering instantaneous magnetic moments.

In order to reduce the time dispersion of the values of the components $m(t_j)$, the step 150 of low-pass filtering using a running mean, or a moving mean, can be performed (FIG. 9).

During an optional sub-step 151, the unit computes the standard deviation $\sigma(\|m(t_j)\|)$ on the N values of the norm $\|m(t_j)\|$ of the instantaneous magnetic moments, or an equivalent parameter representing the dispersion of the values of the norm $\|m(t_j)\|$ of the instantaneous magnetic moments. If the value of the standard deviation $\sigma(\|m(t_j)\|)$ is greater than a predetermined threshold, then the 3N values of components $m(t_j)$ are filtered.

During a sub-step 152, the unit applies a filter $H_K(t_j)$ of the low-pass type, in this case by a running mean on K samples, for example an arithmetical or exponential mean, or an equivalent type of filter, on the time series of 3N values $\{m(t_j)\}_N$ of the components of the instantaneous magnetic moments in the XYZ coordinate system. There is therefore a new time series such that $\{\hat{m}(t_j)\}=H_K(t_j) \cdot \{m(t_j)\}$, where $\hat{m}(t_j)$ represents the filtered values of the components of the instantaneous magnetic moment in the XYZ coordinate system, at the instant $t_j$. Thus, a time series is obtained, called filtered series $\{\hat{m}(t_j)\}_N$, of instantaneous magnetic moments, which is then taken into account for executing the step 230 of estimating the mean angular deviation $\overline{\alpha}$.

Of course, this step 150 of low-pass filtering of the components of the instantaneous magnetic moments can be applied to the time series $\{m(t_j)\}_N$ obtained during the sub-step 122, as in the homogenized time series $\{m^h(t_k)\}_{N'}$.

Preferably, the number K of samples is selected so that the product of K with the mean angular difference $<\Delta\beta_j>$ of the considered time series, for example, the series $\{m(t_j)\}_N$ originating from the sub-step 122, is less than a given value, for example, 45°, and preferably 10°, even 5°, and preferably 1°. Alternatively, the mean angular difference $<\Delta\beta_j>$ can be obtained by the rotation speed of the rotation component multiplied by the sampling frequency. This thus avoids applying excessive filtering that would restrict the considered time series, which would risk concealing the dynamics of the rotation signal.

It is advantageous for the homogenization step 140 to be performed before the step 231 of estimating the invariant vector $m_o$. Furthermore, it is advantageous for the filtering step 150 to be performed before the step 232 of estimating the mean radius $\overline{R}$ of the circle C. Finally, it is advantageous for the filtering step 150 to be performed before the homogenization step 140 so that the time series taken into account in the homogenization step 140 is less noisy.

Figure 8B:
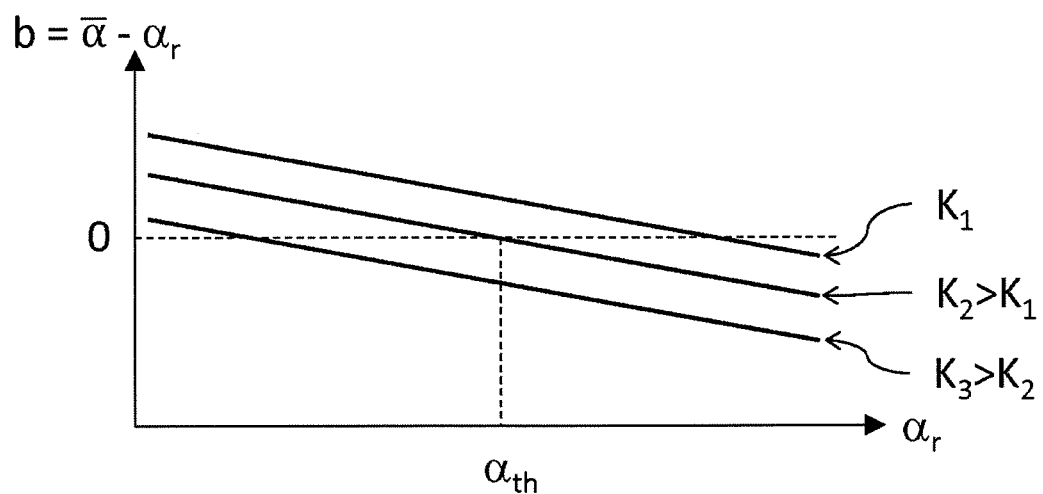

As schematically shown in FIG. 8B, the value of the bias $b=\overline{\alpha}-\alpha_r$ can vary as a function of the value of the actual angular deviation $\alpha_r$. This is shown in FIG. 8B using a refined function, but it can have another type of function. Thus, it appears that the value of the bias is positive for the low angular deviation values and is negative for the high values. It also appears that the value of the actual angular deviation for which the value of the bias b is substantially zero particularly depends on the number K of samples taken into account in the running mean, particularly in the case of an arithmetical running mean.

When the method for estimating the mean angular deviation $\overline{\alpha}$ comprises an additional sub-step of classifying the permanent magnet 2 with a view to implementing sorting as a function of a reference value $\alpha_{th}$ of the angular deviation, it can be advantageous for the number K of samples to be determined that is to be taken into account in the running mean so that the value of the bias is substantially zero at the reference value $\alpha_{th}$. Solely by way of an illustration, for a reference value $\alpha_{th}$ equal to 0.5° and for a time series of 1400 instantaneous magnetic moments for which the mean intensity is 0.165 A·m² with noise interference from an RMS signal of $5.10^{-4}$ A·m², a running mean on K=10 samples can be suitable. Thus, the value of the bias is reduced or even canceled out for the reference value $\alpha_{th}$.

The classification sub-step involves comparing the estimated value of the mean angular deviation $\overline{\alpha}$ with the predetermined reference value $\alpha_{th}$. Thus, a classification and therefore sorting of the magnetic objects can be implemented according to whether or not the mean angular deviation $\overline{\alpha}$ is greater than or less than the reference value $\alpha_{th}$.

By way of an illustration, for a reference value of 0.5°, it can be said that the permanent magnet 2 is usable when its estimated angular deviation is less than or equal to the reference value $\alpha_{th}$ and that it is to be rejected when it is greater than the reference value. Indeed, for an estimated value $\overline{\alpha}$ that is less than the threshold value $\alpha_{th}$, the bias is positive, i.e. the actual value $\alpha_r$ is less than the estimated value. The permanent magnet is then usable. By contrast, for an estimated value $\overline{\alpha}$ that is greater than the threshold value $\alpha_{th}$, the bias is negative, i.e. the actual value $\alpha_r$ is greater than the estimated value. The permanent magnet then needs to be rejected. Of course, the reference value and the decision to implement sorting depend on the applications intended for the permanent magnet.

Figure 10A:
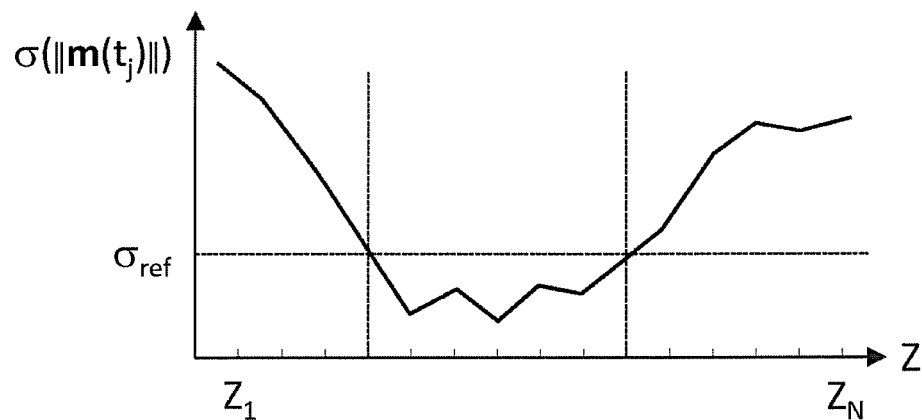
FIG. 10A shows an example of the evolution of the standard deviation of the norm of the instantaneous magnetic moments as a function of the vertical position of the magnetic object facing the measurement plane.
Figure 10B:
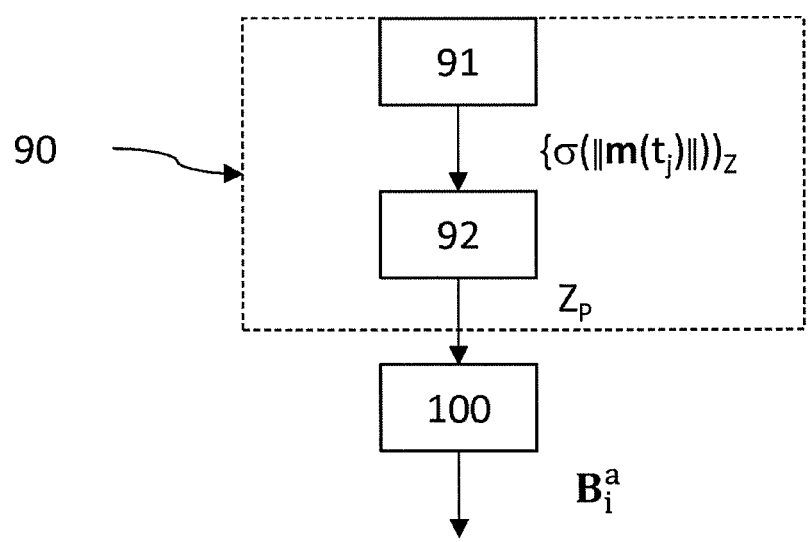
FIG. 10B is a flowchart of a partial example of a method for estimating a mean angular deviation comprising a step of previously positioning the magnetic object.

Furthermore, the method for estimating the angular deviation can comprise a prior step 90 of vertically positioning the permanent magnet 2 facing the measurement plane $P_{mes}$, described with reference to FIGS. 10A and 10B.

This positioning step comprises a sub-step 91 of estimating a parameter representing the dispersion of the values of the intensity of the instantaneous magnetic moment, for different vertical positions along the Z axis above the measurement plane $P_{mes}$.

To this end, the steps 110 and 120 are performed for different vertical positioning values of the object along the Z axis. For each vertical position, a time series of instantaneous magnetic moments is thus obtained, for example the time series $\{m(t_j)\}_N$ obtained during the sub-step 122, and the standard deviation $\sigma(|m(t_j)|)$ is deduced, for example, on the N values of the intensity $\|m(t_j)\|$ of the instantaneous magnetic moments. With reference to FIG. 10A, a spatial series is thus obtained that provides the value of the standard deviation $\sigma(\|m(t_j)\|)$ for various vertical positions Z occupied by the magnetic object.

During a sub-step 92, a vertical position value $Z_P$ is selected, for which value the value of the standard deviation $\sigma(|m(t_j)|)$ on the intensity of the instantaneous magnetic moment is less than a threshold value $\sigma_{ref}$. Then, the magnetic object is positioned so that it occupies the vertical position Zp.

The method for estimating the mean angular deviation $\bar{\alpha}$ then continues with step 100 and steps 120 and 230 described previously, optionally supplemented by steps 140 and 150.

Furthermore, the method can comprise an additional step of estimating a quality indicator of the measurements performed during the measurement duration T. This step preferably can occur following the execution of step 120 or of step 150.

To this end, the computation unit 4 determines the standard deviation $\sigma_R$ on the N values of the instantaneous radius that is estimated from the instantaneous magnetic moments $m(t_j)$. The instantaneous radius can be computed using the relation $R(t_j) = |m(t_j) - m_o|$. In this case, it is computed from the time series $\{m(t_j)\}_N$ obtained during the sub-step 122. The quality indicator in this case is the magnitude $\sigma R/\sqrt{N}$ that allows the precision of the series of measurements to be characterized. Other quality indicators can be used from the standard deviation $\sigma_R$, for example a $\sin((\sigma_R/\sqrt{N})/(<|m(t_j)\|>_N))$ or a $\tan((\sigma_R/\sqrt{N})/(\|m_o\|))$.

In order to detect a potential anomaly that has occurred during the series of measurements, the standard deviation $\sigma_R$ on the N values of the instantaneous radius can be compared to a previously determined reference value $\sigma(\bar{R})$. This value $\sigma(\bar{R})$ can be determined by performing a large number Q of estimates of the mean radius $\bar{R}$ for the same type of permanent magnet 2. The number Q can be greater than 100, even greater than or equal to 1000. The mean radius $\bar{R}$ is estimated, for example, by executing steps 120 and 230, optionally supplemented by steps 140 and 150. Thus, Q times a time distribution $\{R(t_j)\}_N$ of said instantaneous radius $R(t_j)$ is obtained for the same magnetic object. Q is a non-zero natural integer, preferably greater than or equal to 50, even to 100. Then a mean value is estimated, for each of the Q time distributions $\{R(t_j)\}_N$, which mean value is called mean radius $\bar{R}$, which is defined as the time mean of the instantaneous radius $<R(t_j)>_N$. A distribution $\{\bar{R}\}_Q$ is thus obtained of Q estimated mean radii $\bar{R}$. On the basis of this distribution, the mean value $<\bar{R}>_Q$, as well as a parameter for estimating the dispersion of the values of the estimated mean radii $\bar{R}$ around the mean $<\bar{R}>_Q$, is estimated, such that the standard deviation is $\sigma(\bar{R})$. The magnitude $\sigma R$ is compared to $\sigma(\bar{R})$, for example, by computing the ratio $\sigma_R/\sigma(\bar{R})$. When this ratio is greater than or equal to a threshold value, for example 1, 2, or even 3, it is possible to estimate that the measurements performed during the duration T are not representative and therefore must not be taken into account. This error associated with the measurements can originate from a mechanical problem, for example a problem with the stability of the reference axis, or even a magnetic detection problem, for example excessive magnetization of one or more magnetometers.

The invention claimed is:

1. A method for estimating an angular deviation between a reference axis of a magnetic object and a magnetic axis co-linear to a magnetic moment of the magnetic object in order to sort the magnetic object, comprising:
   a) positioning the magnetic object at a fixed position facing at least one magnetometer configured to measure a magnetic field in presence of the magnetic object, the magnetic object remaining at the fixed position during the estimation of the angular deviation;
   b) rotating the magnetic object about the reference axis while maintaining the magnetic object at the fixed position;
   c) measuring, using the magnetometer, the magnetic field at different instants of a measurement duration during the rotating of the magnetic object while the magnetic object is maintained at the fixed position;
   d) estimating the angular deviation from the measurements of the magnetic field;
   e) comparing the angular deviation with a threshold value; and
   f) sorting the magnetic object based a result of the comparison of the angular deviation and the threshold value,
   wherein the magnetic object is a cylindrical magnet having an axis of symmetry, the reference axis being the axis of symmetry of the cylindrical magnet, and
   wherein the d) estimating comprises:
      d1) identifying a minimum magnetic field, and a maximum magnetic field, from the measurements of the magnetic field; and
      d2) computing the angular deviation from the identified minimum and maximum magnetic fields, and from geometric parameters representing the position of the magnetometer relative to the magnetic object.

2. The method as claimed in claim 1, wherein, during the d1) identifying, the minimum and maximum magnetic fields are respectively identified from the minimum and maximum values of the norm of the measurements of the magnetic field.

3. The method as claimed in claim 1, wherein the geometric parameters are coordinates and distance of the magnetometer relative to the magnetic object, in a plane passing through the reference axis and containing the magnetometer.

4. The method as claimed in claim 1, wherein the angular deviation is computed from a coefficient equal to the ratio of the norm of the vector formed from the subtraction of the minimum and maximum magnetic fields to the norm of the vector formed from the addition of the minimum and maximum magnetic fields, and from the geometric parameters.

5. The method as claimed in claim 1, wherein the angular deviation is computed from the following equation:

$$\overline{\alpha} = \tan^{-1}\left(\left(\frac{\|B_{max}^d - B_{min}^d\|}{\|B_{max}^d + B_{min}^d\|}\right) \cdot \left(\frac{\sqrt{r^2z^2 + (z^2 - d^2/a)^2}}{\sqrt{r^2z^2 + (r^2 - d^2/a)^2}}\right)\right),$$

wherein d is distance between the magnetometer and the magnetic object, z and r are coordinates of the magnetometer relative to the magnetic object along an axis, respectively parallel and orthogonal to the reference axis, and wherein a is a predetermined coefficient, and wherein $B_{max}$ and $B_{min}$ correspond to maximum and minimum magnetic field values respectively.

6. The method as claimed in claim 1, wherein, during the b) rotating, the magnetic object completes at least one rotation about the reference axis.

7. The method as claimed in claim 1, wherein the at least one magnetometer comprises at least three axes for detecting the magnetic field, the detection axes being non-parallel to each other.

8. The method as claimed in claim 1, wherein the at least one magnetometer is a single tri-axis magnetometer.

9. The method as claimed in claim 1, wherein the at least one magnetometer is positioned outside the reference axis or outside the perpendicular to the reference axis passing through the magnetic object.

10. The method as claimed in claim 1, wherein the at least one magnetometer is positioned relative to the magnetic object at a coordinate z along an axis parallel to the reference axis and at a coordinate r along an axis orthogonal to the reference axis, such that the coordinate z is greater than or equal to the coordinate r.

11. A method for characterizing a magnetic object having an angular deviation between a reference axis of the magnetic object and a magnetic axis co-linear to a magnetic moment of the magnetic object, comprising:
   implementing the method for estimating the angular deviation as claimed in claim 1;
   computing an amplitude of the magnetic moment associated with the magnetic object, from the estimated angular deviation, of the identified maximum magnetic field, and from the geometric parameters.

12. The method as claimed in claim 11, wherein the amplitude of the magnetic moment is computed from the ratio between the no'iu of the maximum magnetic field and the norm of a magnetic field, for a unitary amplitude of the magnetic field, expressed analytically using the following equation:

$$\hat{B}_{max}^d(\overline{\alpha}, r, z) = \frac{b}{d^5}\begin{pmatrix} -\sin(\overline{\alpha})\dfrac{d^2}{a} + \sin(\overline{\alpha})r^2 + \cos(\overline{\alpha})rz \\ -\cos(\overline{\alpha})\dfrac{d^2}{a} + \cos(\overline{\alpha})z^2 + \sin(\overline{\alpha})rz \end{pmatrix},$$

wherein $\overline{\alpha}$ is the previously estimated angular deviation, d is distance between the magnetometer and the magnetic object, z and r are coordinates of the magnetometer relative to the magnetic object along an axis, respectively parallel and orthogonal to the reference axis, and wherein a and b are predetermined coefficients.

13. A device for estimating an angular deviation between a reference axis of a magnetic object and a magnetic axis co-linear to a magnetic moment of the magnetic object, comprising:
   at least one magnetometer configured to measure, at each measurement instant of a duration, a magnetic field disrupted by the magnetic object;
   a retention and rotation component configured to retain the magnetic object in a determined position facing the at least one magnetometer and of rotating the magnetic object along its reference axis;
   a processor configured to implement the method as claimed in claim 1.

14. A non-transitory computer readable information recording medium, comprising instructions for implementing the method as claimed in claim 1, the instructions being able to be executed by a processor.

15. The method according to claim 1, further comprising rejecting the magnetic object if the angular deviation is greater than the threshold value.

* * * * *